(12) United States Patent
Fujisawa et al.

(10) Patent No.: US 12,355,438 B2
(45) Date of Patent: Jul. 8, 2025

(54) DISPLAY DEVICE, DETECTION DEVICE, AND WATCH

(71) Applicant: Japan Display Inc., Tokyo (JP)

(72) Inventors: Akihiko Fujisawa, Tokyo (JP); Kaoru Ito, Tokyo (JP); Daichi Abe, Tokyo (JP)

(73) Assignee: Japan Display Inc., Tokyo (JP)

( * ) Notice: Subject to any disclaimer, the term of this patent is extended or adjusted under 35 U.S.C. 154(b) by 332 days.

(21) Appl. No.: 18/112,465

(22) Filed: Feb. 21, 2023

(65) Prior Publication Data

US 2023/0198522 A1  Jun. 22, 2023

Related U.S. Application Data

(63) Continuation of application No. PCT/JP2021/030024, filed on Aug. 17, 2021.

(30) Foreign Application Priority Data

Aug. 20, 2020 (JP) ................................. 2020-139301

(51) Int. Cl.
  *H03K 17/96* (2006.01)
  *G06F 3/041* (2006.01)
  (Continued)

(52) U.S. Cl.
  CPC ........... *H03K 17/96* (2013.01); *G06F 3/0412* (2013.01); *G06F 3/04883* (2013.01); *G06F 3/0448* (2019.05); *H03K 2017/9613* (2013.01)

(58) Field of Classification Search
  CPC ............ H03K 17/96; H03K 2017/9613; G06F 3/0412; G06F 3/04883; G06F 3/0448
  See application file for complete search history.

(56) References Cited

U.S. PATENT DOCUMENTS

| 10,444,900 B2 * | 10/2019 | Ko ....................... G06F 3/04166 |
| 10,732,780 B2 * | 8/2020 | Joo .......................... G06F 3/044 |

(Continued)

FOREIGN PATENT DOCUMENTS

| JP | 5832772 | 12/2015 |
| JP | 2020-005211 | 1/2020 |
| WO | 2017/149677 | 9/2017 |

OTHER PUBLICATIONS

International Search Report issued Nov. 22, 2021 in corresponding PCT Application No. PCT/JP2021/030024.

*Primary Examiner* — Anne M Hines
(74) *Attorney, Agent, or Firm* — K&L Gates LLP

(57) ABSTRACT

According to one embodiment, a display device includes a display area, a first sensor electrode, a second sensor electrode and a detector. The display area displays an image. The first sensor electrode is disposed in a peripheral area surrounding the display area. The second sensor electrode is disposed in the peripheral area and disposed adjacent to the first sensor electrode. The detector is electrically connected to the first sensor electrode and the second sensor electrode. The first sensor electrode and the second sensor electrode both have a body portion and a comb tooth portion having a plurality of linear electrodes. A comb tooth portion of the first sensor electrode and a comb tooth portion of the second sensor electrode are disposed at mutually different locations.

17 Claims, 17 Drawing Sheets

(51) Int. Cl.
 *G06F 3/04883* (2022.01)
 *G06F 3/044* (2006.01)

(56) References Cited

U.S. PATENT DOCUMENTS

| | | |
|---|---|---|
| 2015/0153887 A1 | 6/2015 | Kim et al. |
| 2015/0268782 A1 | 9/2015 | Kim et al. |
| 2016/0034087 A1 | 2/2016 | Kim et al. |
| 2016/0035290 A1 | 2/2016 | Kim et al. |
| 2020/0004372 A1 | 1/2020 | Kamiya et al. |
| 2020/0057513 A1* | 2/2020 | Matsushita ............. G06F 1/169 |

* cited by examiner

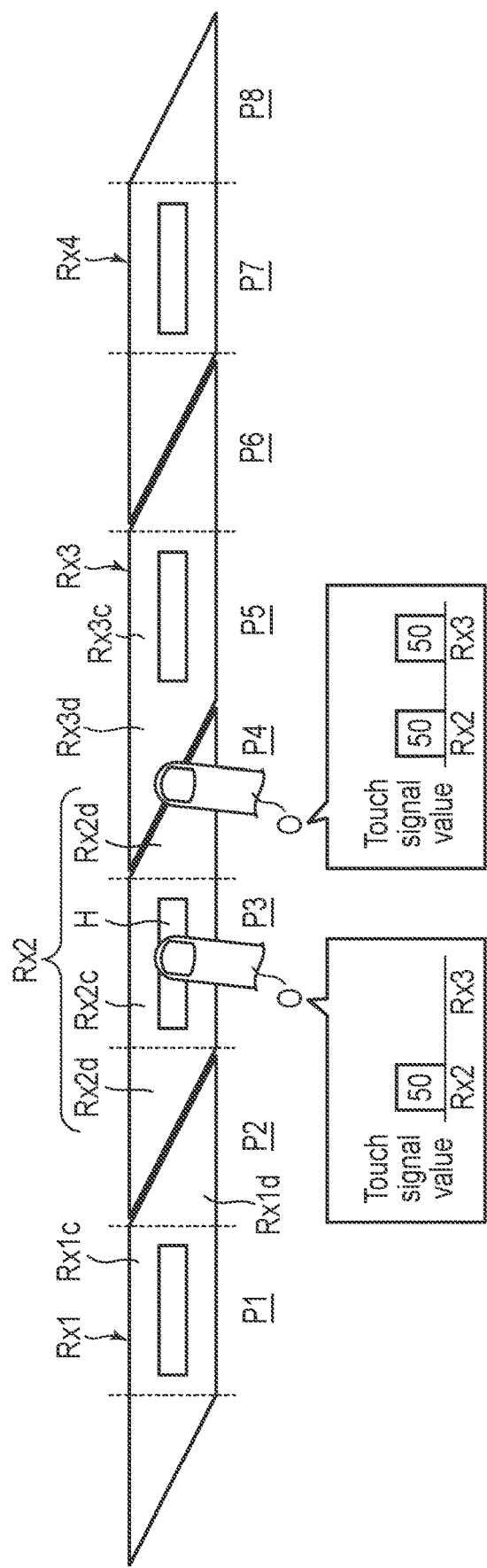
F I G. 14

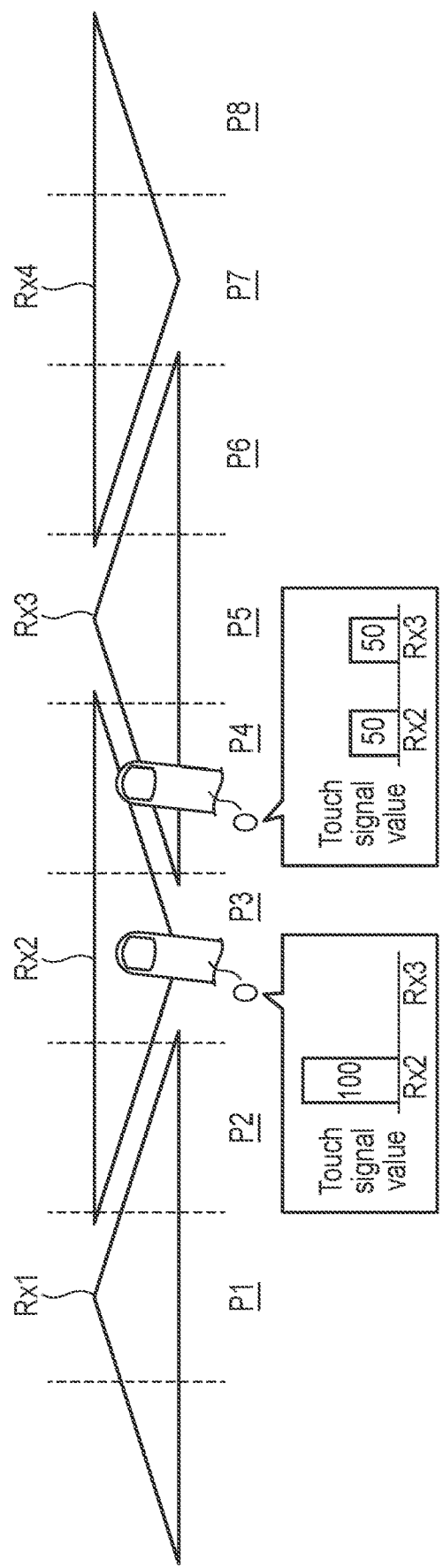
F I G. 15

DISPLAY DEVICE, DETECTION DEVICE, AND WATCH

CROSS-REFERENCE TO RELATED APPLICATIONS

This application is a Continuation Application of PCT Application No. PCT/JP2021/030024, filed Aug. 17, 2021, and based upon and claiming the benefit of priority from Japanese Patent Application No. 2020-139301, filed Aug. 20, 2020, the entire contents of all of which are incorporated herein by reference.

FIELD

Embodiments described herein relate generally to a display device, a detection device, and a watch.

BACKGROUND

In recent years, wearable devices with a touch detection function (for example, a wristwatch-type wearable device, an eyeglass-type wearable device, and the like) have been gradually widespread. Such wearable devices are required to achieve display quality at the time of displaying an image and excellent operability by touch together, and various developments have been made.

BRIEF DESCRIPTION OF THE DRAWINGS

FIG. 14 is a developed view showing a third modified example of the detection electrode according to the same embodiment.

FIG. 15 is a developed view showing a fourth modified example of the detection electrode according to the same embodiment.

DETAILED DESCRIPTION

Figure 1:
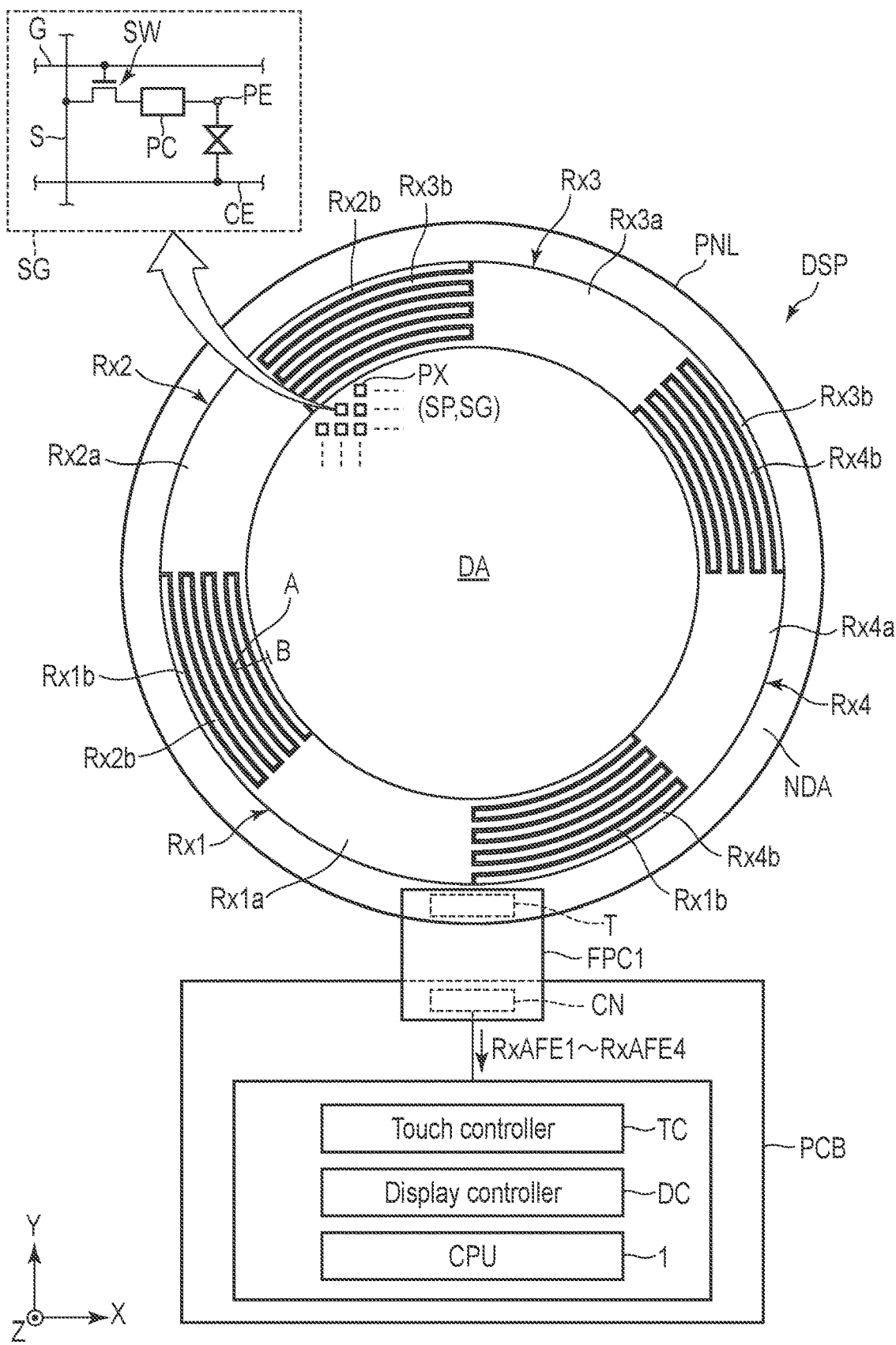
FIG. 1 is a planar view showing a configuration example of a display device according to a first embodiment.

In general, according to one embodiment, a display device includes a display area, a first sensor electrode, a second sensor electrode and a detector. The display area displays an image. The first sensor electrode is disposed in a peripheral area surrounding the display area. The second sensor electrode is disposed in the peripheral area and disposed adjacent to the first sensor electrode. The detector is electrically connected to the first sensor electrode and the second sensor electrode. The first sensor electrode and the second sensor electrode both have a body portion and a comb tooth portion having a plurality of linear electrodes. A comb tooth portion of the first sensor electrode and a comb tooth portion of the second sensor electrode are disposed at mutually different locations.

According to another embodiment, a watch includes the above-described display device.

According to another embodiment, a display device includes a display area, a first sensor electrode, a second sensor electrode and a detector. The display area displays an image. The first sensor electrode is disposed in a peripheral area surrounding the display area. The second sensor electrode is disposed in the peripheral area and disposed adjacent to the first sensor electrode. The detector is electrically connected to the first sensor electrode and the second sensor electrode. The first sensor electrode and the second sensor electrode both have a body portion and a tapered portion. A tapered portion of the first sensor electrode and a tapered portion of the second sensor electrode are disposed to face each other. All the body portions and the tapered portions of the first sensor electrode and the second sensor electrode are disposed along an outer periphery of the display area formed in a curved shape.

According to another embodiment, a watch includes the above-described display device.

According to another embodiment, a detection device includes a first sensor electrode, a second sensor electrode and a detector. The second sensor electrode is disposed adjacent to the first sensor electrode. The detector is electrically connected to the first sensor electrode and the second sensor electrode. The first sensor electrode and the second sensor electrode both have a body portion and a comb tooth portion having a plurality of linear electrodes. A comb tooth portion of the first sensor electrode and a comb tooth portion of the second sensor electrode are disposed at mutually different locations. A body portion of the first sensor electrode is disposed in a first region. A body portion of the second sensor electrode is disposed in a second region different from the first region. The comb tooth portion of the first sensor electrode and the comb tooth portion of the second sensor electrode are disposed in a third region, which is different from the first region and the second region. Areas of the first region, the second region, and the third region are equal.

According to another embodiment, a watch includes the above-described detection device.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

In the present embodiment, a display device with a touch detection function will be described as an example of a display device. There are various touch detection types such as an optical type, a resistance type, a capacitive type, and an electromagnetic induction type. Among the various detection types described above, the capacitive type is a detection type that uses a change in electrostatic capacitance due to an approach or contact of an object (for example, a finger), and has advantages that its implementation is possible with a relatively simple structure, that energy consumption is small, and the like. In the present embodiment, the display device with the touch detection function using the capacitive type will be mainly described.

Incidentally, the capacitive type includes mutual capacitive sensing that generates an electric field between a pair of transmitting electrode (drive electrode) and receiving electrode (detection electrode) disposed to be spaced apart from each other and detects a change in the electric field due to an approach or contact of an object, and a self-capacitive type that uses a single electrode to detect a change in the electrostatic capacitance due to the approach or contact of the object. In the present embodiment, a display device with a touch detection function using self-capacitive sensing will be mainly described.

FIG. 1 is a planar view showing a configuration example of a display device DSP according to a first embodiment. For example, a first direction X, a second direction Y, and a third direction Z are orthogonal to each other, but may intersect each other at an angle other than 90 degrees. The first direction X and the second direction Y correspond to directions parallel to a surface of a substrate forming the display device DSP and the third direction Z corresponds to a thickness direction of the display device DSP. In the present specification, a direction toward a tip of an arrow indicating the third direction Z may be referred to as an upward direction, and a direction toward the opposite of the tip of the arrow may be referred to as a downward direction. In addition, it is assumed that there is an observation position where the display device DSP is observed on the tip side of the arrow indicating the third direction Z, and viewing from this observation position toward an X-Y plane defined by the first direction X and the second direction Y is referred to as a planar view.

As shown in FIG. 1, the display device DSP includes a display panel PNL, a flexible printed circuit FPC1, and a circuit board PCB. The display panel PNL and the circuit board PCB are electrically connected via the flexible printed circuit FPC1. More specifically, a terminal portion T of the display panel PNL and a connector CN of the circuit board PCB are electrically connected via the flexible printed circuit FPC1.

The display panel PNL includes a display area DA that displays an image, and a non-display area NDA formed in a frame shape and surrounding the display area DA. The display area DA may also be referred to as a display region. In addition, the non-display area NDA may also be referred to as a peripheral portion or a peripheral area. In the display area DA, a pixel PX is disposed. Specifically, in the display area DA, a large number of the pixels PX are arranged in a matrix along the first direction X and the second direction Y. In the present embodiment, the pixel PX includes sub-pixels SP of red (R), green (G), and blue (B). In addition, each of the sub-pixels SP includes a plurality of segment pixels SG. The respective segment pixels SG have pixel electrodes having different areas, and gradation is formed for each of the sub-pixels SP by switching between display and non-display of the plurality of segment pixels SG.

A region of the innermost circle among concentric circles shown in FIG. 1 corresponds to the display area DA, and a region obtained by removing the innermost circle from the outermost circle corresponds to the non-display area NDA. Incidentally, a case where the display area DA has a circular shape and the non-display area NDA surrounding the display area DA also has a shape of the same system is exemplified in the present embodiment, but the present embodiment is not limited thereto, and the display area DA does not necessarily have a circular shape, and the non-display area NDA may have a shape of a system different from that of the display area DA. For example, the display area DA and the non-display area NDA may have polygonal shapes. Furthermore, when the display area DA has a polygonal shape, the non-display area NDA may have a circular shape having a shape of a system different from that of the display area DA.

As shown in FIG. 1, a plurality of detection electrodes (sensor electrodes) Rx1 to Rx4 are disposed in the non-display area NDA so as to surround the display area DA. The plurality of detection electrodes Rx1 to Rx4 are disposed along the outer periphery of the circular display area DA. The detection electrode Rx1 is disposed so as to be adjacent to the detection electrodes Rx2 and Rx4 in a direction along the outer periphery of the display area DA. The detection electrode Rx2 is disposed so as to be adjacent to the detection electrodes Rx3 and Rx1 in the direction along the outer periphery of the display area DA. The detection electrode Rx3 is disposed so as to be adjacent to the detection electrodes Rx4 and Rx2 in the direction along the outer periphery of the display area DA. The detection electrode Rx4 is disposed so as to be adjacent to the detection electrodes Rx1 and Rx3 in the direction along the outer periphery of the display area DA.

The plurality of detection electrodes Rx1 to Rx4 include arcuate body portions Rx1a to Rx4a and comb tooth portions Rx1b to Rx4b having a plurality of linear electrodes. The comb tooth portions Rx1b to Rx4b of each of the plurality of detection electrodes Rx1 to Rx4 extend from both end portions of each of the arcuate body portions Rx1a to Rx4a toward the body portions of the adjacent detection electrodes in the direction along the outer periphery of the display area DA.

For example, the comb tooth portions Rx1*b* of the detection electrode Rx1 extend, respectively, from one end of the body portion Rx1*a* toward one end of the body portion Rx2*a* of the detection electrode Rx2 adjacent in the direction (clockwise direction) along the outer periphery of the display area DA, and from the other end of the body portion Rx1*a* toward one end of the body portion Rx4*a* of the detection electrode Rx4 adjacent in the direction (counterclockwise direction) along the outer periphery of the display area DA. The comb tooth portions Rx2*b* of the detection electrode Rx2 extend, respectively, from one end of the body portion Rx2*a* toward one end of the body portion Rx3*a* of the detection electrode Rx3 adjacent in the direction (clockwise direction) along the outer periphery of the display area DA, and from the other end of the body portion Rx2*a* toward one end of the body portion Rx1*a* of the detection electrode Rx1 adjacent in the direction (counterclockwise direction) along the outer periphery of the display area DA. The comb tooth portions Rx3*b* of the detection electrode Rx3 extend, respectively, from one end of the body portion Rx3*a* toward one end of the body portion Rx4*a* of the detection electrode Rx4 adjacent in the direction (clockwise direction) along the outer periphery of the display area DA, and from the other end of the body portion Rx3*a* toward one end of the body portion Rx2*a* of the detection electrode Rx2 adjacent in the direction (counterclockwise direction) along the outer periphery of the display area DA. The comb tooth portions Rx4*b* of the detection electrode Rx4 extend, respectively, from one end of the body portion Rx4*a* toward one end of the body portion Rx1*a* of the detection electrode Rx1 adjacent in the direction (clockwise direction) along the outer periphery of the display area DA, and from the other end of the body portion Rx4*a* toward one end of the body portion Rx3*a* of the detection electrode Rx3 adjacent in the direction (counterclockwise direction) along the outer periphery of the display area DA.

Incidentally, the comb tooth portions Rx1*b* to Rx4*b* of the plurality of detection electrodes Rx1 to Rx4 do not overlap each other in planar view. In other words, the comb tooth portions Rx1*b* to Rx4*b* of the plurality of detection electrodes Rx1 to Rx4 are disposed at mutually different locations as shown in FIG. 1. In addition, the comb tooth portions Rx1*b* to Rx4*b* of each of the plurality of detection electrodes Rx1 to Rx4 are not connected to the body portions of other detection electrodes adjacent in the direction along the outer periphery of the display area DA.

Although FIG. 1 shows the four detection electrodes Rx1 to Rx4, the number of detection electrodes Rx disposed in the non-display area NDA is not limited thereto, and any number of detection electrodes Rx may be disposed along the outer periphery of the display area DA. Each of the plurality of detection electrodes Rx1 to Rx4 is electrically connected to an Rx wiring layer RL, which will be described later, via a conductive material (a conductive bead coated with metal) (not shown). The Rx wiring layer RL includes a pad, an Rx wiring line extending from the pad toward the terminal portion T, and the like. The Rx wiring line is a wiring line used to supply a drive signal to the detection electrodes Rx1 to Rx4 and output detection signals RxAFE1 to RxAFE4 from the detection electrodes Rx1 to Rx4.

The segment pixel SG includes a switching element SW, a pixel circuit PC, a pixel electrode PE, a common electrode CE, a liquid crystal layer LC, and the like as shown in an enlarged manner in FIG. 1. The switching element SW is configured, for example, using a thin-film transistor (TFT), and is electrically connected to a scanning line G and a signal line S. The scanning line G is electrically connected to the switching element SW in each of the segment pixels SG aligned in the first direction X. The signal line S is electrically connected to the switching element SW in each of the segment pixels SG aligned in the second direction Y. The pixel electrode PE is electrically connected to the switching element SW via the pixel circuit PC. Each of the pixel electrodes PE is opposed to the common electrode CE and drives the liquid crystal layer LC by an electric field generated between the pixel electrode PE and the common electrode CE.

As shown in FIG. 1, a touch controller TC, a display controller DC, a CPU 1, and the like are disposed on the circuit board PCB. The touch controller TC outputs a drive signal to the plurality of detection electrodes Rx1 to Rx4 disposed on the display panel PNL, and receives inputs of the detection signals (RxAFE signals) from the detection electrodes Rx1 to Rx4 (in other words, detects an approach or contact of an external proximity object). The touch controller TC may be referred to as a detector. The display controller DC outputs a video signal indicating an image displayed on the display area DA of the display panel PNL. The CPU 1 performs output of a synchronization signal defining operation timings of the touch controller TC and the display controller DC, execution of an operation corresponding to a touch detected by the touch controller TC, and the like.

Figure 2:
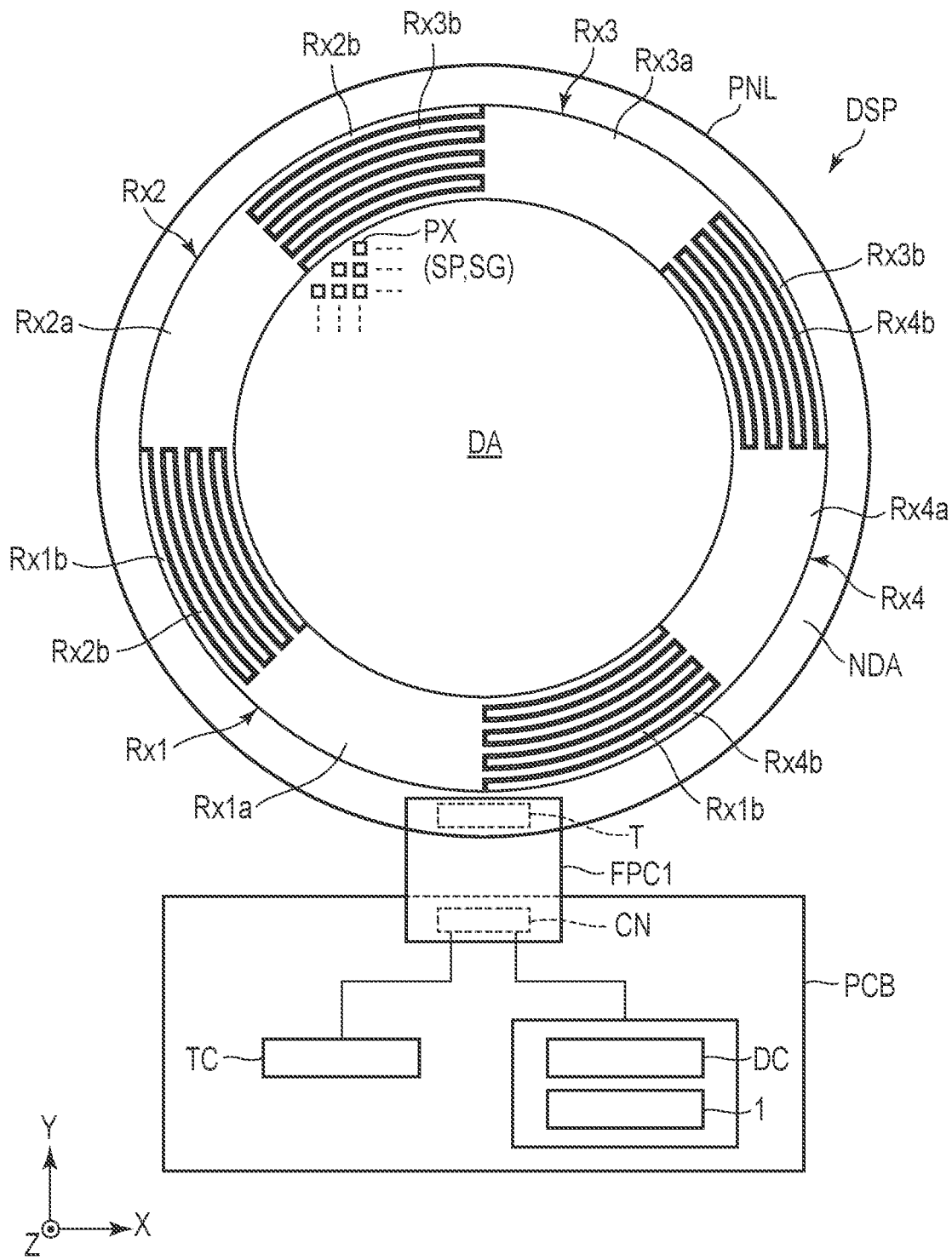
FIG. 2 is a planar view showing another configuration example of the display device according to the same embodiment.
Figure 3:
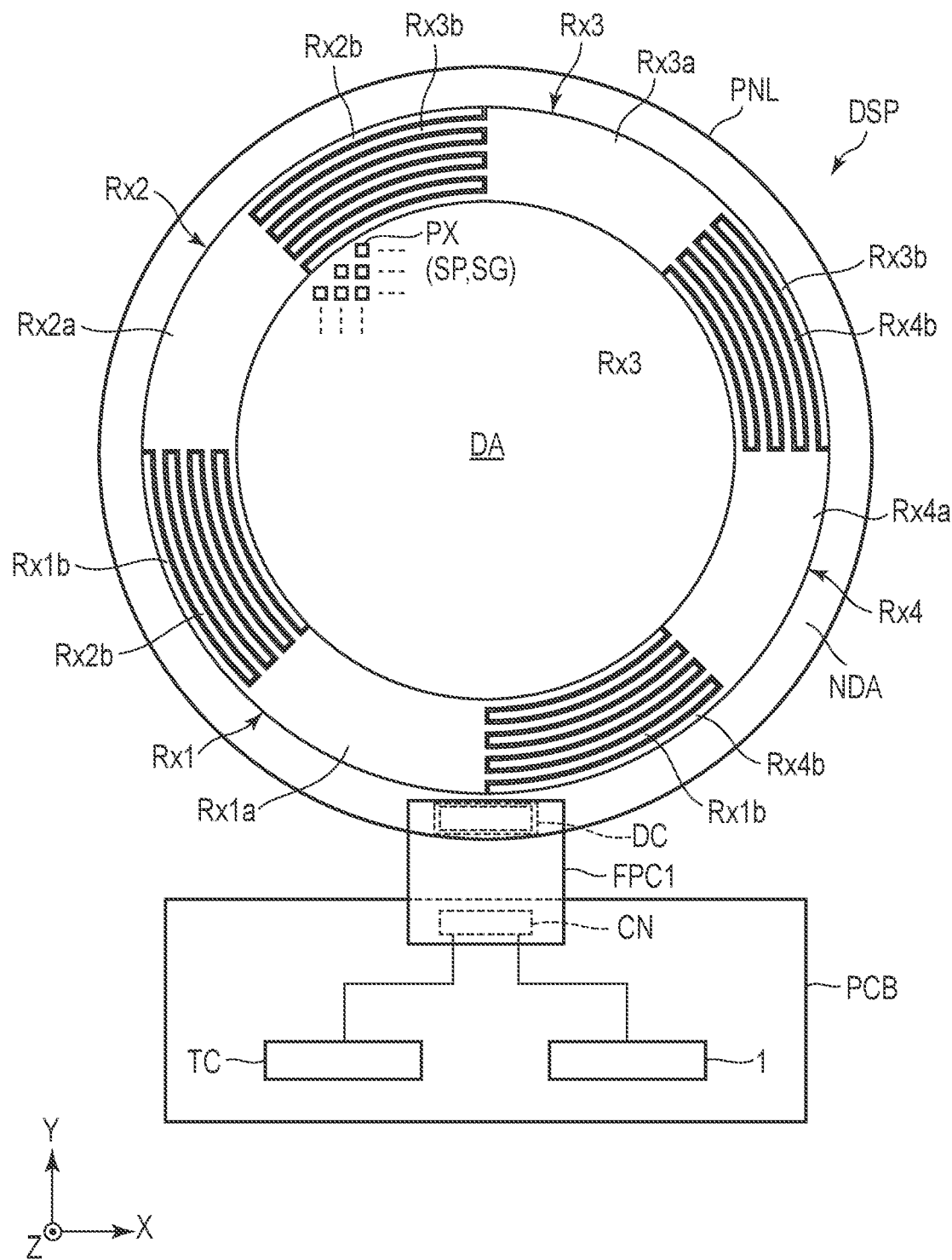
FIG. 3 is a planar view showing still another configuration example of the display device according to the same embodiment.
Figure 4:
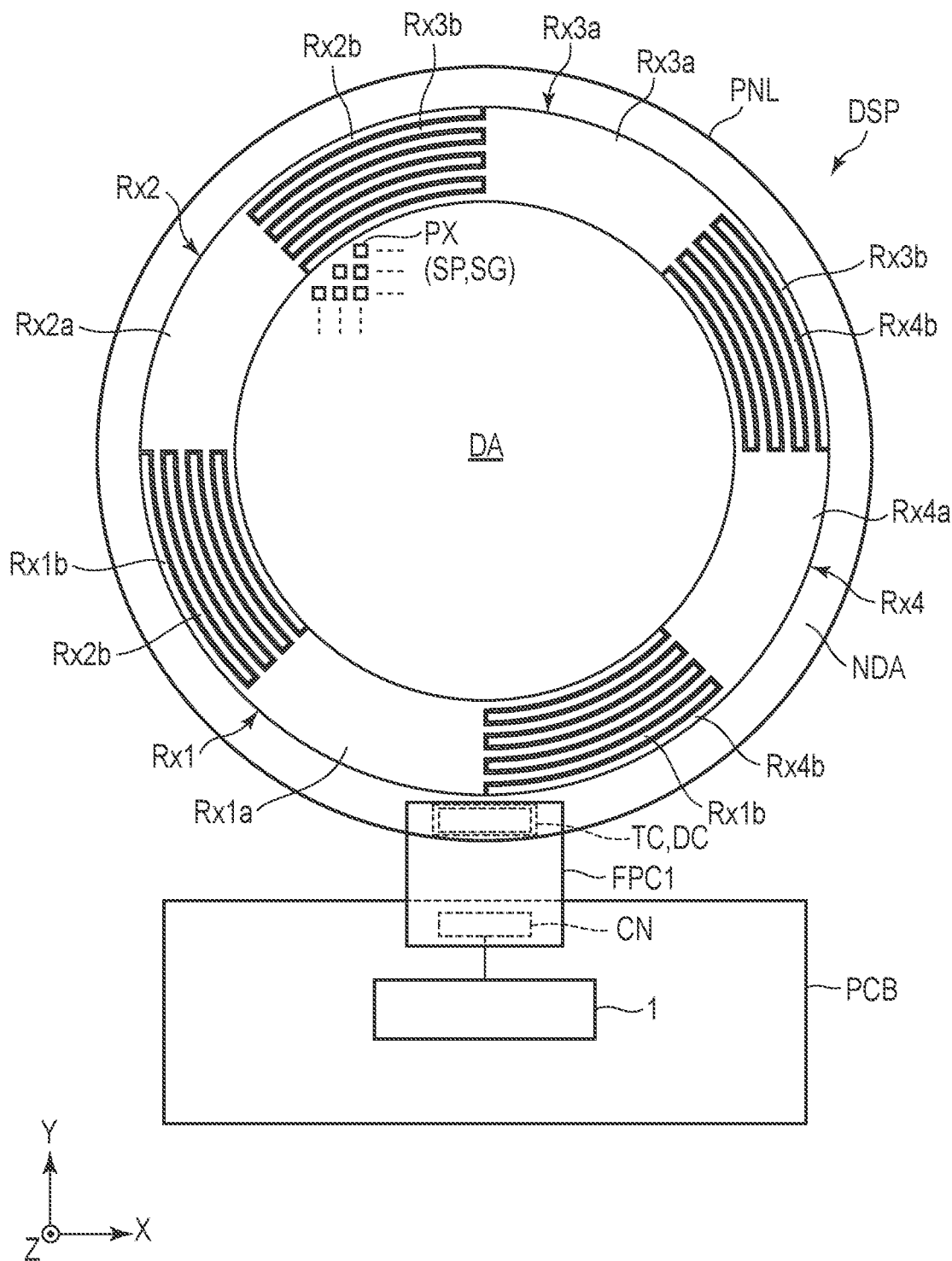
FIG. 4 is a planar view showing even still another configuration example of the display device according to the same embodiment.

Incidentally, FIG. 1 shows a case where the touch controller TC, the display controller DC, and the CPU 1 are achieved by one semiconductor chip, mounting forms of these are not limited thereto. For example, as shown in FIG. 2, only the touch controller TC may be separated as a separate body, and the respective portions may be mounted on the circuit board PCB. As shown in FIG. 3, the touch controller TC and the CPU 1 are separately mounted on the circuit board PCB, and the display controller DC may be mounted on the display panel PNL by chip on glass (COG). As shown in FIG. 4, only the CPU 1 may be mounted on the circuit board PCB, and the touch controller TC and the display controller DC may be mounted on the display panel PNL by COG.

Figure 5:
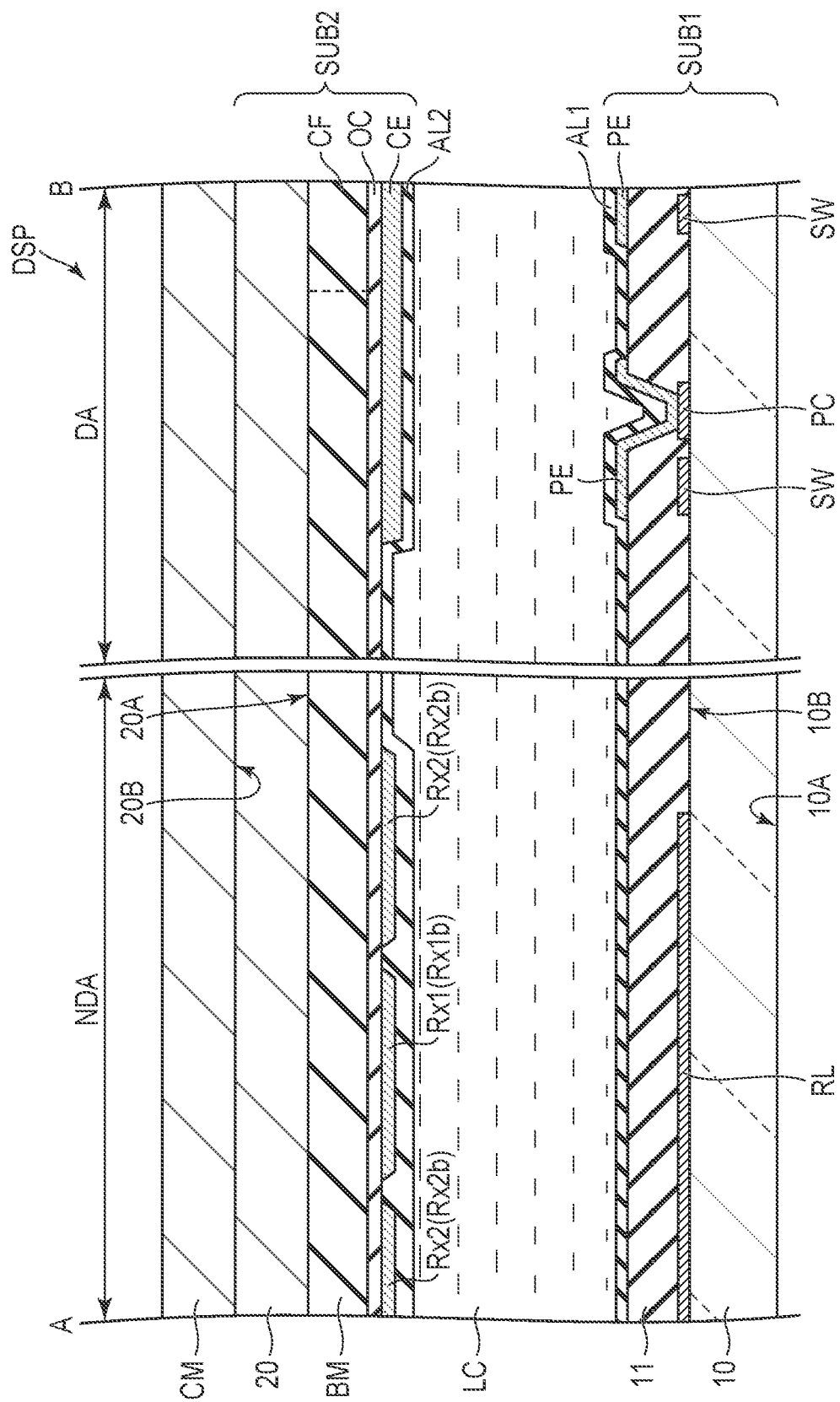
FIG. 5 is a cross-sectional view showing a configuration example of the display device taken along line A-B shown in FIG. 1.

FIG. 5 is a cross-sectional view showing a cross section of the display device DSP taken along line A-B in FIG. 1. Hereinafter, each of a configuration on the display area DA side and a configuration on the non-display area NDA side will be described.

The display device DSP includes a first substrate SUB1, a second substrate SUB2, a liquid crystal layer LC, and a cover member CM. The first substrate SUB1 and the second substrate SUB2 are formed like flat plates parallel to the X-Y plane. The first substrate SUB1 and the second substrate SUB2 overlap each other in planar view, and are bonded to each other by a sealant (not shown). The liquid crystal layer LC is held between the first substrate SUB1 and the second substrate SUB2, and sealed by a sealant.

Incidentally, FIG. 5 shows a case where the display device DSP is a reflective type display device in which a backlight unit is not disposed, but the present embodiment is not limited thereto, and the display device DSP may be a display device employing an organic EL as a pixel or a transmissive type display device in which a backlight unit is disposed. Alternatively, the display device DSP may be a display device in which the reflection type and the transmissive type are combined. As the backlight unit, various forms of backlight units can be used, and for example, a backlight unit using a light-emitting diode (LED) as a light source, a backlight unit using a cold-cathode fluorescent lamp (CCFL), and the like can be used.

On the display area DA side, the first substrate SUB1 includes a transparent substrate 10, the switching element SW, the pixel circuit PC, a planarization film 11, the pixel electrode PE, and an alignment film AL1 as shown in FIG. 5. The first substrate SUB1 includes the scanning line G, the signal line S, and the like shown in FIG. 1 in addition to the above-described configuration, but these are not shown in FIG. 5.

The transparent substrate 10 includes a surface (lower surface) 10A and a surface (upper surface) 10B opposite to the surface 10A. The switching element SW and the pixel circuit PC are disposed on the surface 10B side. The planarization film 11 includes at least one insulating film, and covers the switching element SW and the pixel circuit PC. The pixel electrode PE is disposed on the planarization film 11, and is connected to the pixel circuit PC through a contact hole formed in the planarization film 11. The switching element SW, the pixel circuit PC, and the pixel electrode PE are disposed for each of the segment pixels SG. The alignment film AL1 covers the pixel electrode PE and is in contact with the liquid crystal layer LC.

Incidentally, FIG. 5 shows the switching element SW and the pixel circuit PC in a simplified manner, but actually, the switching element SW and the pixel circuit PC include a semiconductor layer and an electrode of each layer. In addition, the switching element SW and the pixel circuit PC are electrically connected though not shown in FIG. 5. Furthermore, as described above, the scanning line G and the signal line S not shown in FIG. 5 are disposed, for example, between the transparent substrate 10 and the planarization film 11.

On the display area DA side, the second substrate SUB2 includes a transparent substrate 20, a color filter CF, an overcoat layer OC, the common electrode CE, and an alignment film AL2 as shown in FIG. 5.

The transparent substrate 20 includes a surface (lower surface) 20A and a surface (upper surface) 20B opposite to the surface 20A. The surface 20A of the transparent substrate 20 is opposed to the surface 10B of the transparent substrate 10. The color filter CF is disposed on the surface 20A side of the transparent substrate 20. The color filter CF includes a red color filter, a green color filter, a blue color filter, and the like. The overcoat layer OC covers the color filter CF. The common electrode CE is disposed across the plurality of segment pixels SG (the plurality of pixels PX), and is opposed to the plurality of pixel electrodes PE in the third direction Z. The common electrode CE is disposed on the overcoat layer OC. The alignment film AL2 covers the common electrode CE and is in contact with the liquid crystal layer LC. Incidentally, a configuration in which a light-shielding film that defines each of the segment pixels SG is not provided has been described as the configuration of the second substrate SUB2 on the display area DA side in FIG. 5. However, a configuration may be adopted in which a light-shielding film is provided to define each of the segment pixels SG and the light-shielding film overlaps a part of the color filter CF.

The liquid crystal layer LC is disposed between the surface 10A and the surface 20A.

The transparent substrates 10 and 20 are insulating substrates, for example, glass substrates, plastic substrates, or the like. The planarization film 11 is made of a transparent insulating material, for example, silicon oxide, silicon nitride, silicon oxynitride, acrylic resin, or the like. For example, the planarization film 11 includes an inorganic insulating film and an organic insulating film. The pixel electrode PE is formed as a reflecting electrode, and has, for example, a three-layer laminated structure of indium zinc oxide (IZO), silver (Ag), and indium zinc oxide (IZO). The common electrode COM is a transparent electrode formed of a transparent conductive material, for example, indium tin oxide (ITO), indium zinc oxide (IZO), or the like. The alignment films AL1 and AL2 are horizontal alignment films each having an alignment restriction force substantially parallel to the X-Y plane. The alignment restriction force may be imparted by a rubbing treatment or a photo-alignment treatment.

On the non-display area NDA side, the first substrate SUB1 includes the transparent substrate 10, the Rx wiring layer RL, the planarization film 11, and the alignment film AL1 as shown in FIG. 5.

Hereinafter, detailed descriptions of the configurations that have been already described on the display area DA side will be omitted.

The Rx wiring layer RL is disposed on the transparent substrate 10. Although the Rx wiring layer RL is shown in a simplified manner in FIG. 5 for convenience, the Rx wiring layer RL includes the pad, the Rx wiring line extending from the pad toward the terminal portion T, and the like, and is electrically connected to the detection electrode Rx disposed on the second substrate SUB2 side via the conductive material as described above.

On the non-display area NDA side, the second substrate SUB2 includes the transparent substrate 20, a light-shielding film BM, the overcoat layer OC, the detection electrodes Rx2 and Rx1, and the alignment film AL2 as shown in FIG. 5. Hereinafter, detailed descriptions of the configurations that have been already described on the display area DA side will be omitted.

The light-shielding film BM is disposed on the surface 20A side of the transparent substrate 20. The light-shielding film BM is disposed over substantially the entire surface of the non-display area NDA. The overcoat layer OC covers the light-shielding film BM together with the color filter CF on the display area DA side. The detection electrodes Rx2 and Rx1 are disposed on the overcoat layer OC. The detection electrode Rx2 shown in FIG. 5 corresponds to a part of the comb tooth portion Rx2$b$, and the detection electrode Rx1 corresponds to a part of the comb tooth portion Rx1$b$. There is a gap between the comb tooth portion Rx2$b$ of the detection electrode Rx2 and the comb tooth portion Rx1$b$ of the detection electrode Rx1 so as to be out of contact with each other. In the configuration shown in FIG. 5, the detection electrodes Rx2 and Rx1 are disposed in the same layer as the common electrode CE on the display area DA side, and are formed of, for example, the same transparent conductive material as the common electrode CE. The alignment film AL2 covers the detection electrodes Rx2 and RX1 and is in contact with the liquid crystal layer LC.

Incidentally, a configuration in a case where a liquid crystal mode, which is classified into two according to a direction of application of an electric field to change the alignment of liquid crystal molecules contained in the liquid crystal layer LC, is a so-called vertical electric field mode is exemplified in FIG. 5, but the present configuration is also applicable to a case where the liquid crystal mode is a so-called horizontal electric field mode. The above-described vertical electric field mode includes, for example, a twisted nematic (TN) mode, a vertical alignment (VA) mode, and the like. In addition, the horizontal electric field mode includes, for example, an in-plane switching (IPS) mode and a fringe field switching (FFS) mode which is one of the IPS modes. When the horizontal electric field mode is adopted, the common electrode CE provided in the display region is provided on the first substrate SUB1 side and faces the pixel electrode PE with a thin insulating layer interposed therebetween.

Figure 6:
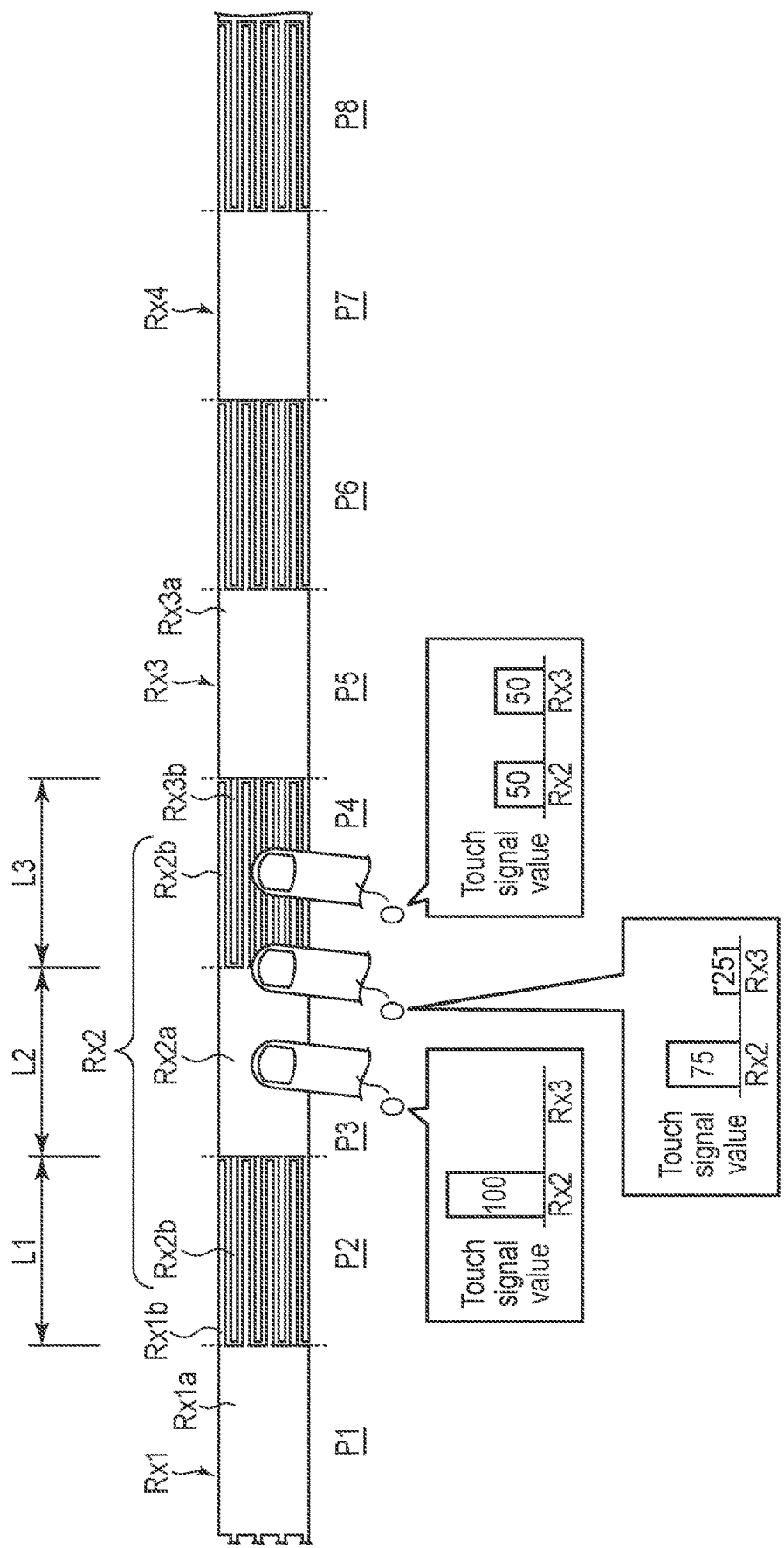
FIG. 6 is a developed view of a detection electrode shown in FIG. 1.

FIG. 6 is a developed view of the detection electrodes Rx1 to Rx4 shown in FIG. 1. Incidentally, the detection electrodes Rx1 to Rx4 have the same shape, and thus, only the detection electrode Rx2 will be described hereinafter, and a description regarding the other detection electrodes Rx1, Rx3, and Rx4 will be omitted.

As shown in FIG. 6, the detection electrode Rx2 includes the body portion Rx2a and the comb tooth portions Rx2b. The comb tooth portions Rx2b extend from both ends of the body portion Rx2a toward the body portions Rx1a and Rx3a of the adjacent detection electrodes Rx1 and Rx3. Out of the comb tooth portions Rx2b, the comb tooth portion Rx2b extending toward the body portion Rx1a of the adjacent detection electrode Rx1 is disposed at a different location from the comb tooth portion Rx1b of the detection electrode Rx1. Out of the comb tooth portions Rx2b, the comb tooth portion Rx2b extending toward the body portion Rx3a of the adjacent detection electrode Rx3 is disposed at a different location from the comb tooth portion Rx3b of the detection electrode Rx3.

The detection electrode Rx2 is formed such that a width L2 of the body portion Rx2a and widths L1 and L3 of the two comb tooth portions Rx2b extending from both the ends of the body portion Rx2a are substantially the same. In other words, the detection electrode Rx2 is formed such that the widths L1 to L3 have a substantially one-to-one relationship. That is, areas of a region where the body portion Rx2a of the detection electrode Rx2 is located, a region where one of the comb tooth portions Rx2b is located, and a region where the other comb tooth portion Rx2b is located are substantially the same.

Here, as shown in FIG. 6, a position where the body portion Rx1a of the detection electrode Rx1 is located is defined as a position P1; a position where the comb tooth portions Rx1b and Rx2b of the detection electrodes Rx1 and Rx2 are located is defined as a position P2; a position where the body portion Rx2a of the detection electrode Rx2 is located is defined as a position P3; a position where the comb tooth portions Rx2b and Rx3b of the detection electrodes Rx2 and Rx3 are located is defined as a position P4; a position where the body portion Rx3a of the detection electrode Rx3 is located is defined as a position P5; a position where the comb tooth portions Rx3b and Rx4b of the detection electrodes Rx3 and Rx4 are located is defined as a position P6; a position where the body portion Rx4a of the detection electrode Rx4 is located is defined as a position P7; and a position where the comb tooth portions Rx4b and Rx1b of the detection electrodes Rx4 and Rx1 are located is defined as a position P8.

Then, a case where the position P3 is touched by a finger O as shown in FIG. 6 is assumed. In this case, the finger O comes into contact with the body portion Rx2a of the detection electrode Rx2, and thus, only a waveform (signal value) of a detection signal RxAFE2 among detection signals RxAFE1 to RxAFE4 output from the detection electrodes Rx1 to Rx4 changes due to electrostatic capacitance of the finger O. Incidentally, here, the sum of signal values of the detection signals RxAFE output from all the detection electrodes Rx is 100, and the signal value of the detection signal RxAFE output from the detection electrode Rx not in contact with the finger O indicates zero.

As described above, since the finger O is in contact with only the body portion Rx2a of the detection electrode Rx2 when the position P3 is touched by the finger O, the signal value of the detection signal RxAFE2 output from the detection electrode Rx2 is 100, and all the signal values of the detection signals RxAFE1, RxAFE3, and RxAFE4 output from the other detection electrodes Rx1, Rx3, and Rx4 not in contact with the finger O are zero.

Incidentally, here, changes in the detection signal RxAFE2 output from the detection electrode Rx2 and the detection signal RxAFE3 output from the detection electrode Rx3 in the case where the position P3 is touched by the finger O, in a case where a portion between the positions P3 and P4 is touched by the finger O, and in a case where the position P4 is touched by the finger O are focused on as will be described in detail below. When the position P3 is touched by the finger O, the signal value of the detection signal RxAFE2 output from the detection electrode Rx2 is 100 and the signal value of the detection signal RxAFE3 output from the detection electrode Rx3 is zero as shown in a graph on the left side among three graphs of FIG. 6.

Next, the case where the portion between the positions P3 and P4 is touched by the finger O as shown in FIG. 6 is assumed. In this case, the left half of the finger O comes into contact with the body portion Rx2a of the detection electrode Rx2, and the right half of the finger O comes into contact with the comb tooth portions Rx2b and Rx3b of the detection electrodes Rx2 and Rx3. Accordingly, changes in the signal values of the detection signals RxAFE2 and RxAFE3 among the detection signals RxAFE1 to RxAFE4 output from the detection electrodes Rx1 to Rx4 are observed due to the electrostatic capacitance of the finger O.

As described above, since the left half of the finger O is in contact with the body portion Rx2a of the detection electrode Rx2, and the right half of the finger O is in contact with the comb tooth portions Rx2b and Rx3b of the detection electrodes Rx2 and Rx3 when the finger O touches the portion between the positions P3 and P4, a ratio between a contact area of the finger O in contact with the detection electrode Rx2 and a contact area of the finger O in contact with the detection electrode Rx3 can be approximated to 3:1. Since the signal value of the detection signal RxAFE is proportional to the contact area between the detection electrode Rx and the finger O, a ratio of the signal values (signal ratio) can also be approximated to 3:1. In other words, as shown in the graph in the middle of FIG. 6, the signal value of the detection signal RxAFE2 output from the detection electrode Rx2 is 75, and the signal value of the detection signal RxAFE3 output from the detection electrode Rx3 is 25. Incidentally, the signal values of the detection signals RxAFE1 and RxAFE4 output from the detection electrodes Rx1 and Rx4 not in contact with the finger O are both zero.

Furthermore, the case where the position P4 is touched by the finger O is assumed. In this case, the finger O comes into contact with the comb tooth portions Rx2b and Rx3b of the detection electrodes Rx2 and Rx3 disposed at mutually different locations. Accordingly, changes in the signal values of the detection signals RxAFE2 and RxAFE3 among the detection signals RxAFE1 to RxAFE4 output from the detection electrodes Rx1 to Rx4 are observed due to the electrostatic capacitance of the finger O.

As described above, since the finger O is in contact with the comb tooth portions Rx2b and Rx3b of the detection electrodes Rx2 and Rx3 when the position P4 is touched by the finger O, the ratio between the contact area of the finger O in contact with the detection electrode Rx2 and the contact area of the finger O in contact with the detection electrode Rx3 can be approximated to 1:1. As described above, since the signal value of the detection signal RxAFE is proportional to the contact area between the detection electrode Rx and the finger O, in this case, the signal value of the detection signal RxAFE2 output from the detection electrode Rx2 is 50, and the signal value of the detection signal RxAFE3 output from the detection electrode Rx3 is also 50 as shown in the graph on the right side of FIG. 6. Incidentally, the signal values of the detection signals RxAFE1 and RxAFE4 output from the detection electrodes Rx1 and Rx4 not in contact with the finger O are both zero.

In FIG. 6, the change in the signal value of the detection signal RxAFE when the position P3, the portion between the position P3 and the position P4, or the position P4 is touched by the finger O has been described. Even when other positions and a portion between the other positions are touched by the finger O, the signal value of the detection signal RxAFE changes according to a principle similar to that in the case of FIG. 6.

The signal values of the detection signals RxAFE1 to RxAFE4 output from the detection electrodes Rx1 to Rx4 are output to the touch controller TC. The touch controller TC can detect (determine) which position is touched by the finger O with reference to the signal values (signal ratios) of the detection signals RxAFE1 to RxAFE4.

Figure 7:
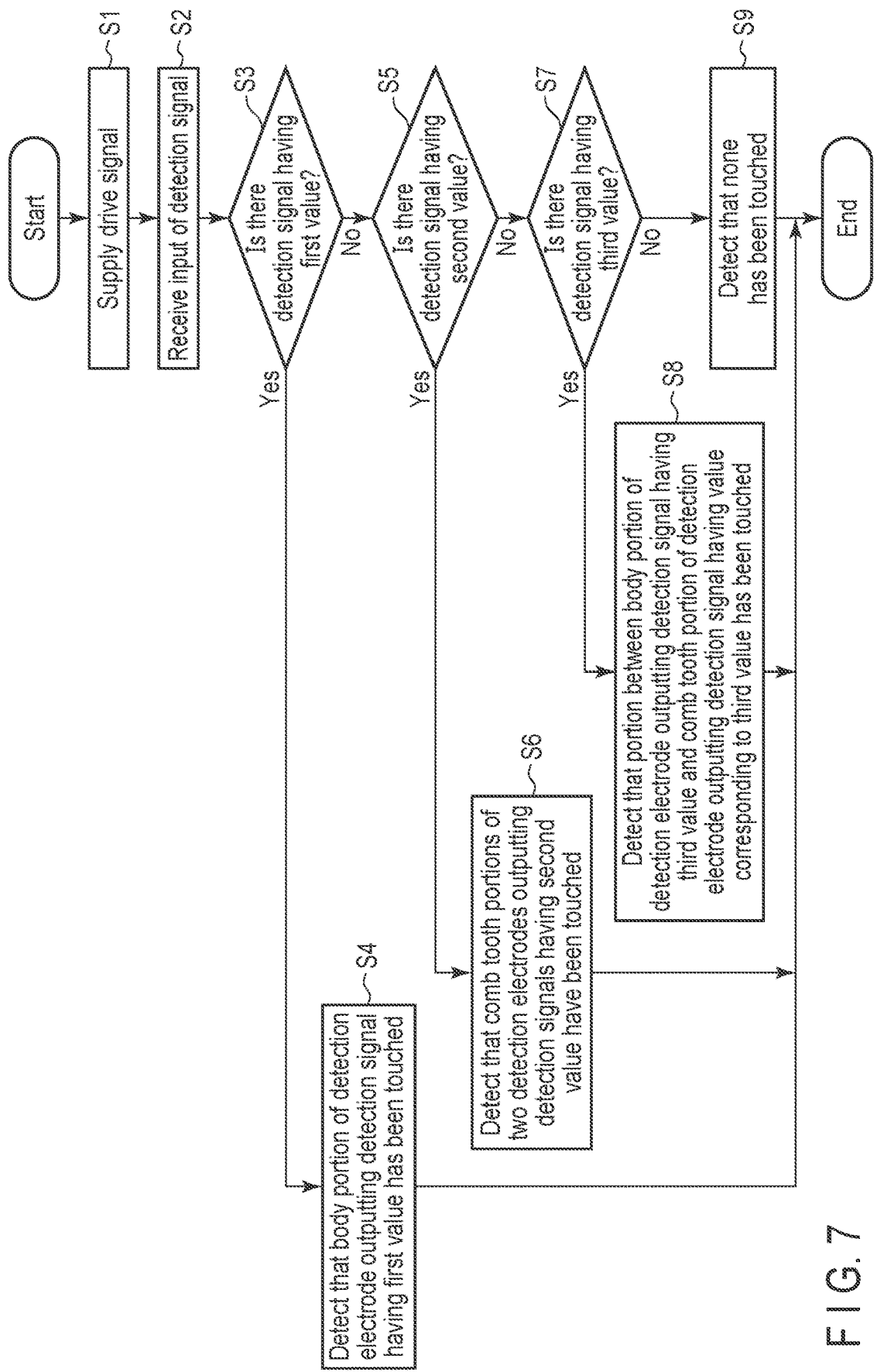
FIG. 7 is a flowchart showing an example of a touch detection operation by the display device according to the same embodiment.

Here, an example of a touch detection operation by the display device DSP will be described with reference to a flowchart of FIG. 7.

First, the touch controller TC outputs a drive signal to the plurality of detection electrodes Rx (step S1). Subsequently, the touch controller TC receives inputs of the detection signals RxAFE respectively output from the detection electrodes Rx in response to the input of the drive signal (step S2).

Next, the touch controller TC refers to signal values of the respective input detection signals RxAFE, and determines whether or not there is a detection signal RxAFE having a signal value of 100 (first value) (step S3). In other words, the touch controller TC refers to the signal values of the respective input detection signals RxAFE and determines whether or not the state shown in the graph on the left side of FIG. 6 is formed. Incidentally, it is determined whether or not there is the detection signal RxAFE having the signal value of 100 here, but the present embodiment is not limited thereto, and for example, it may be determined whether or not there is a detection signal RxAFE having a signal value (for example, a signal value of 90 to 100) within a first range.

As a result of the processing in step S3, when it is determined that there is the detection signal RxAFE having the signal value of 100 (Yes in step S3), the touch controller TC detects that a position where a body portion of the sub-detection electrode Rx outputting the detection signal RxAFE is located has been touched (step S4), and ends the series of operations here.

On the other hand, when it is determined that there is no detection signal RxAFE having the signal value of 100 as a result of the processing in step S3 (No in step S3), the touch controller TC refers to the signal values of the respective input detection signals RxAFE, and determines whether there is a detection signal RxAFE having a signal value of 50 (second value) (step S5). In other words, the touch controller TC refers to the signal values of the respective input detection signals RxAFE and determines whether or not the state shown in the graph on the right side of FIG. 6 is formed. Incidentally, it is determined whether or not there is the detection signal RxAFE having the signal value of 50 here, but the present embodiment is not limited thereto, and for example, it may be determined whether or not there is a detection signal RxAFE having a signal value (for example, a signal value of 40 to 60) within a second range.

As a result of the processing in step S5, when it is determined that there is the detection signal RxAFE having the signal value of 50 (Yes in step S5), the touch controller TC detects that a position where comb tooth portions of the two detection electrodes Rx outputting the detection signals RxAFE each having the signal value of 50 are located has been touched (step S6), and ends the series of operations here.

On the other hand, when it is determined that there is no detection signal RxAFE having the signal value of 50 as a result of the processing in step S5 (No in step S5), the touch controller TC refers to the signal values of the respective input detection signals RxAFE, and determines whether there is a detection signal RxAFE having a signal value of 75 (third value) (step S7). In other words, the touch controller TC refers to the signal values of the respective input detection signals RxAFE and determines whether or not the state shown in the graph in the middle of FIG. 6 is formed. Incidentally, it is determined whether or not there is the detection signal RxAFE having the signal value of 75 here, but the present embodiment is not limited thereto, and for example, it may be determined whether or not there is a detection signal RxAFE having a signal value (for example, a signal value of 70 to 80) within a third range. In addition, it is determined whether or not there is the detection signal RxAFE having the signal value of 75 here, but the present embodiment is not limited thereto, and it may be determined whether or not there is a detection signal RxAFE having a signal value of 25.

As a result of the processing in step S7, when it is determined that there is the detection signal RxAFE having the signal value of 75 (Yes in step S7), the touch controller TC detects that a position between the body portion of the detection electrode Rx outputting the detection signal RxAFE having the signal value of 75 and the comb tooth portion of the detection electrode outputting the detection signal RxAFE having the signal value of 25 has been touched (step S8), and ends the series of operations here.

On the other hand, when it is determined that there is no detection signal RxAFE having the signal value of 75 as a result of the processing in step S7 (No in step S7), the touch controller TC confirms that the signal values of all the detection signals RxAFE are zero, then, determines that no position has been touched (step S9), and ends the series of operations here.

Although the case where the widths of the body portions Rx1a to Rx4a of the detection electrodes Rx1 to Rx4 and the widths of the comb tooth portions Rx1b to Rx4b are substantially the same has been described in FIG. 6 described above, shapes of the detection electrodes Rx1 to Rx4 are not limited thereto. Hereinafter, modified examples of the detection electrodes Rx1 to Rx4 will be described with reference to FIGS. 8 and 9.

Figure 8:
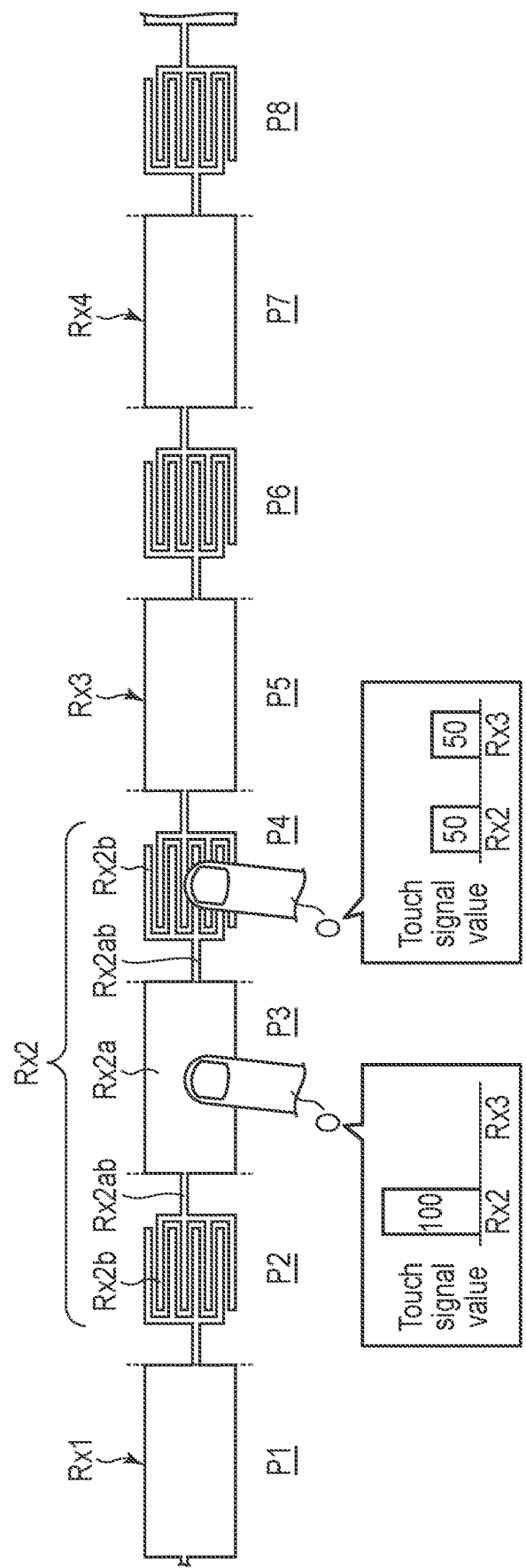
FIG. 8 is a developed view showing a first modified example of the detection electrode according to the same embodiment.

FIG. 8 is a developed view showing a first modified example of the detection electrodes Rx1 to Rx4. Incidentally, since the detection electrodes Rx1 to Rx4 have the same shape, only the detection electrode Rx2 is focused on here as well. The first modified example shown in FIG. 8 is different from the case of FIG. 6 in that the body portion Rx2a and the comb tooth portion Rx2b are connected by a wire portion Rx2ab, and a pattern-less region in which no electrode other than the wire portion Rx2ab is disposed between positions is provided. Therefore, even if the finger O touches a portion between the positions (for example, between the positions P3 and P4), the finger O is less likely to come into contact with the wire portion Rx2ab, so that the touch detection between the positions can be substantially omitted. As described above, it is necessary to capture a slight change in the signal value of the detection signal RxAFE in the touch detection between the positions, and thus, there is also a possibility that error detection occurs. However, it is possible to omit the touch detection between the positions in the configuration according to the present modified example, and thus, it is possible to suppress the occurrence of the error detection described above.

Figure 9:
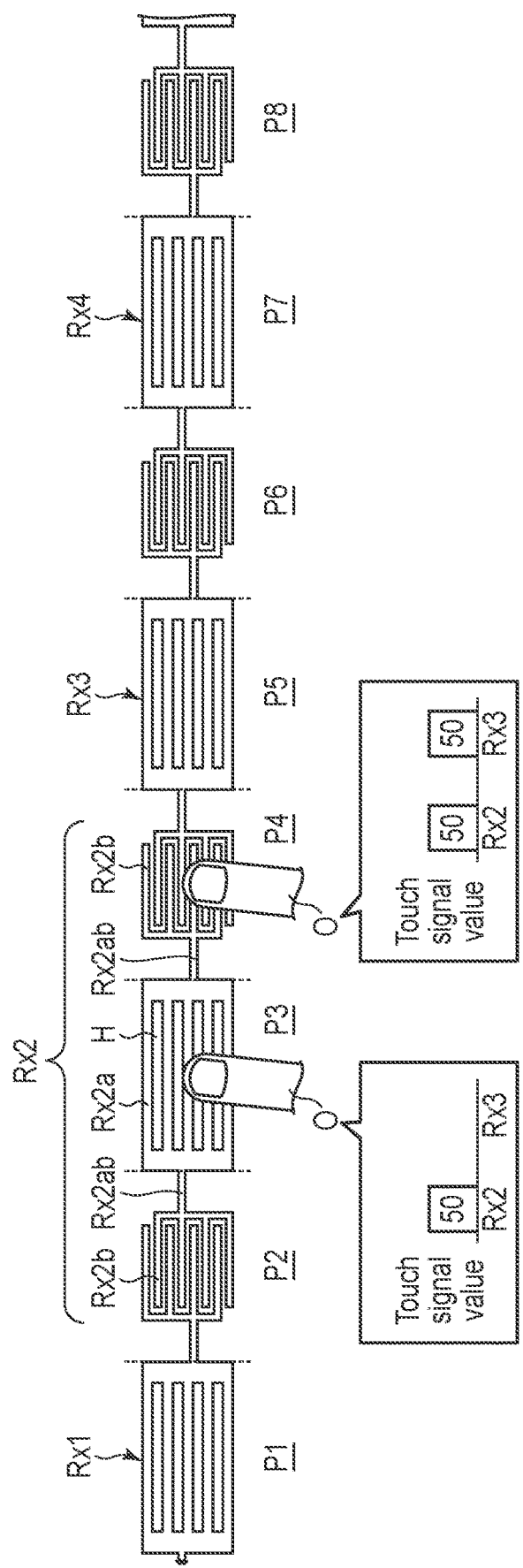
FIG. 9 is a developed view showing a second modified example of the detection electrode according to the same embodiment.

FIG. 9 is a developed view showing a second modified example of the detection electrodes Rx1 to Rx4. Incidentally, since the detection electrodes Rx1 to Rx4 have the same shape, only the detection electrode Rx2 is focused on here as well. The second modified example shown in FIG. 9 is different from the case of FIG. 6 in that the body portion Rx2a and the comb tooth portion Rx2b are connected by a wire portion Rx2ab, and a pattern-less region is provided. The second modified example shown in FIG. 9 is different from the case of FIG. 6 in that the body portion Rx2a has a region H (a slit or an opening portion) from which a part of the detection electrode Rx2 is removed. Accordingly, an area where the body portion Rx2 is in contact with the finger O when the body portion Rx2a is touched and an area where the comb tooth portion Rx2b is in contact with the finger O when the comb tooth portion Rx2b is touched can be made substantially the same. Since a signal value of the detection signal RxAFE is proportional to a contact area with the finger O, a signal value of the detection signal RxAFE output when the body portion Rx2a is touched and a signal value of the detection signal RxAFE output when the comb tooth portion Rx2b is touched can be matched with each other by setting a contact area between the body portion Rx2a and the finger O and a contact area between the comb tooth portion Rx2b and the finger O to be substantially the same. For this reason, the touch controller TC may detect that the body portion Rx2a is touched when a signal value of one detection signal RxAFE is a predetermined value, and may detect that the comb tooth portion Rx2b is touched when signal values of the two detection signals RxAFE are the predetermined value. In other words, even if the touch controller TC does not hold a plurality of values related to the signal values, the touch controller TC can detect which position is touched if the touch controller TC holds one value related to the signal value.

Figure 10:
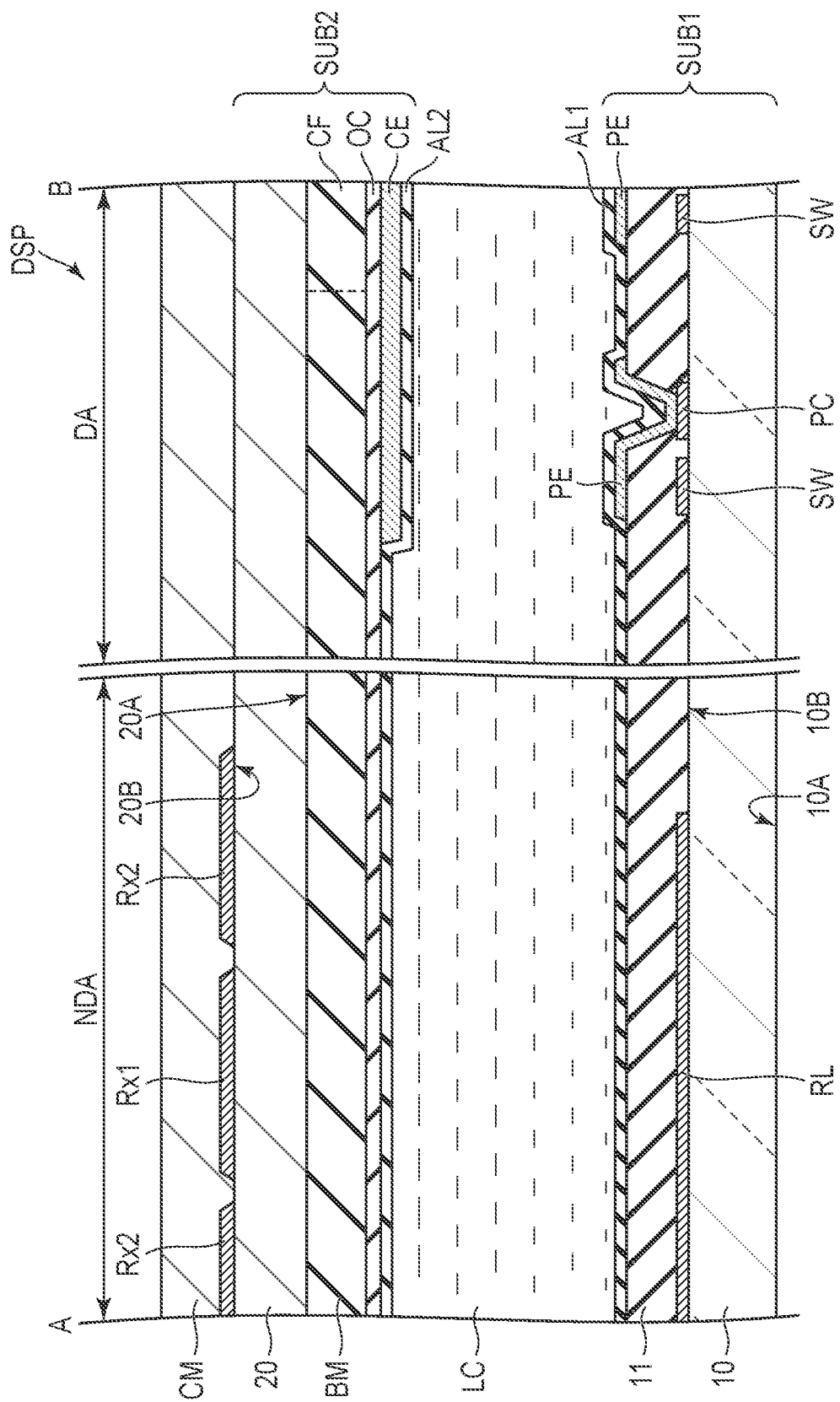
FIG. 10 is a cross-sectional view showing another configuration example of the display device according to the same embodiment.
Figure 11:
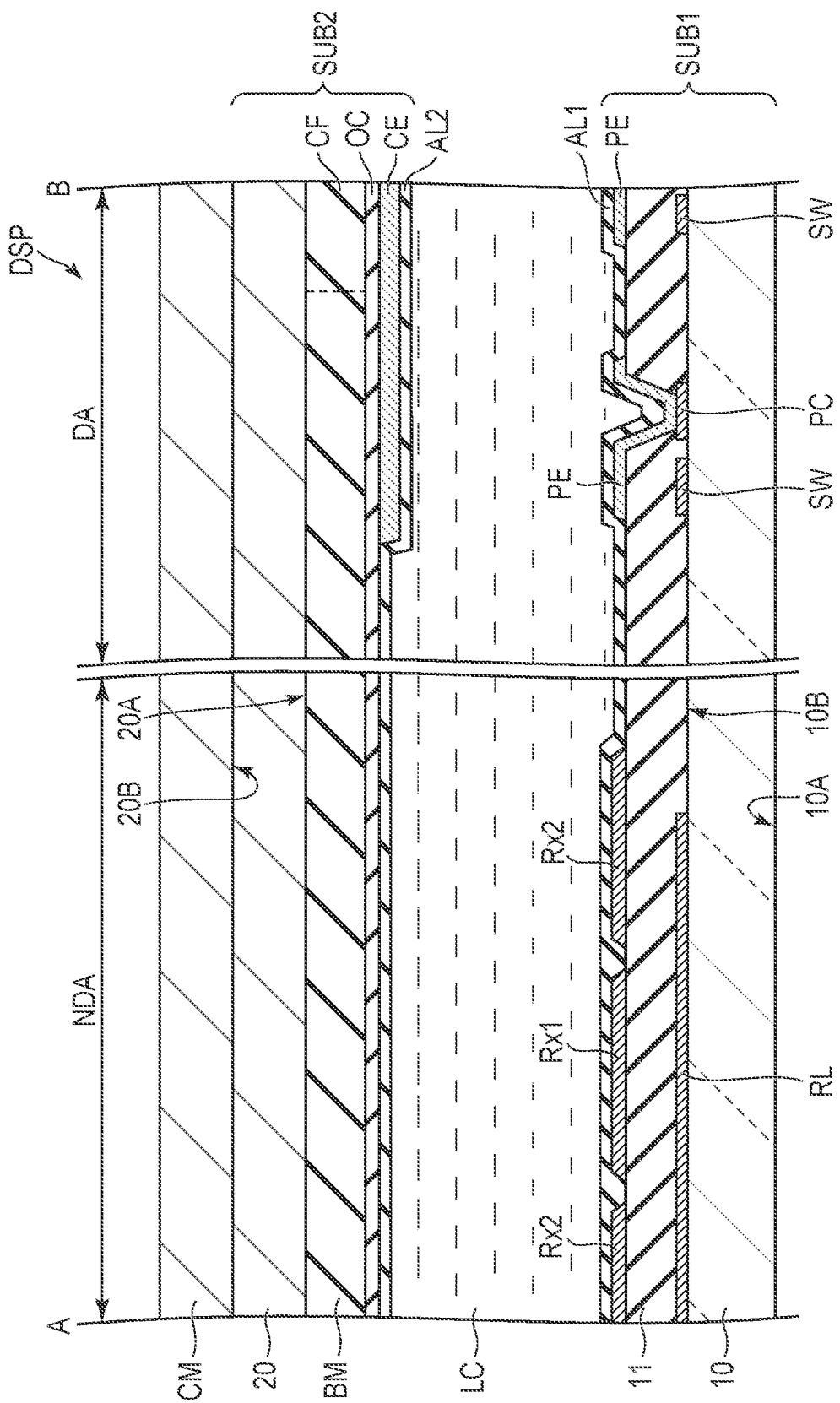
FIG. 11 is a cross-sectional view showing still another configuration example of the display device according to the embodiment.

In the present embodiment described above, the detection electrode Rx is disposed on the surface 20A side of the transparent substrate 20 (in other words, is disposed in the same layer as the common electrode CE) as shown in FIG. 5, but the detection electrode Rx may be disposed on the surface 20B side of the transparent substrate 20 (in other words, may be disposed in a different layer from the common electrode CE) as shown in FIG. 10. In addition, the detection electrode Rx is disposed on the second substrate SUB2 side as shown in FIG. 5 in the present embodiment, but the detection electrode Rx may be disposed on the first substrate SUB1 side as shown in FIG. 11. Since configurations shown in FIGS. 10 and 11 are similar to the configurations described above except that the detection electrodes Rx are disposed differently, the touch controller TC can execute the series of touch detection operations shown in FIG. 7.

According to the first embodiment described above, the display device DSP includes the detection electrodes Rx1 to Rx4 each including the body portion and the comb tooth portions extending from both ends of the body portion. In addition, the touch controller TC of the display device DSP has a function of detecting which position of the non-display area NDA is touched using a difference (signal ratio) in signal values of the detection signals RxAFE1 to RxAFE4 output from the detection electrodes Rx1 to Rx4 each having the body portion and the comb tooth portions. Specifically, the touch controller TC can detect which position of the region where the body portion of the detection electrode Rx is disposed, the region where the comb tooth portions of the adjacent detection electrodes Rx are disposed at mutually different positions, and the region between the body portion and the comb tooth portion is touched, and thus, it is unnecessary to provide a detection electrode for detecting only the region where the comb tooth portion is disposed, and the number of detection electrodes disposed in the non-display area NDA can be reduced. When the number of the detection electrodes Rx is reduced, the number of the Rx wiring layers RL electrically connected to the detection electrodes Rx can be similarly reduced, and further, the number of pins required for the terminal portion T and the connector CN can be reduced.

Second Embodiment

Figure 12:
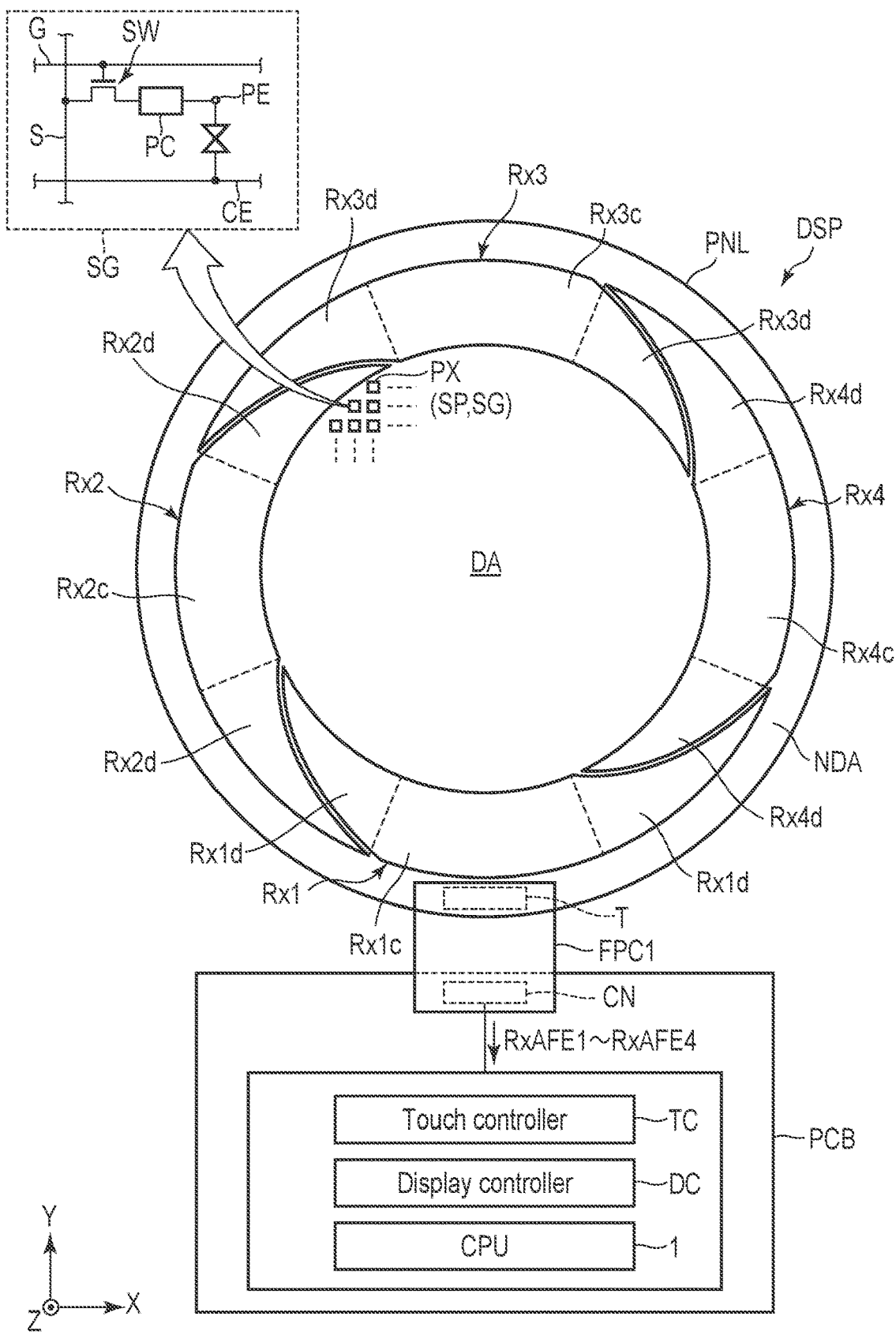
FIG. 12 is a planar view showing a configuration example of a display device according to a second embodiment.

Next, a second embodiment will be described. As shown in FIG. 12, a display device DSP according to the present embodiment is different from the first embodiment described above in that a detection electrode Rx has a tapered portion. As shown in FIG. 12, detection electrodes Rx1 to Rx4 include arcuate body portions Rx1c to Rx4c and tapered portions Rx1d to Rx4d. The tapered portions Rx1d to Rx4d of the plurality of detection electrodes Rx1 to Rx4 extend from vertexes of arcuate body portions Rx1c to Rx4c toward vertexes of body portions of adjacent detection electrodes in a direction along an outer periphery of a display area DA.

For example, the tapered portions Rx1d of the detection electrode Rx1 extend, respectively, from the vertex on the outer peripheral side of one end portion of the body portion Rx1c toward the vertex on the inner peripheral side of the body portion Rx2c of the detection electrode Rx2 adjacent in the direction (clockwise direction) along the outer periphery of the display area DA, and from the vertex on the inner peripheral side of the other end portion of the body portion Rx1c toward the vertex on the outer peripheral side of the body portion Rx4c of the detection electrode Rx4 adjacent in the direction (counterclockwise direction) along the outer periphery of the display area DA. For example, the tapered portions Rx2d of the detection electrode Rx2 extend, respectively, from the vertex on the outer peripheral side of one end portion of the body portion Rx2c toward the vertex on the inner peripheral side of the body portion Rx3c of the detection electrode Rx3 adjacent in the direction (clockwise direction) along the outer periphery of the display area DA, and from the vertex on the inner peripheral side of the other end portion of the body portion Rx2c toward the vertex on the outer peripheral side of the body portion Rx1c of the detection electrode Rx1 adjacent in the direction (counterclockwise direction) along the outer periphery of the display area DA. The tapered portions Rx3d of the detection electrode Rx3 extend, respectively, from the vertex on the outer peripheral side of one end portion of the body portion Rx3c toward the vertex on the inner peripheral side of the body portion Rx4c of the detection electrode Rx4 adjacent in the direction (clockwise direction) along the outer periphery of the display area DA, and from the vertex on the inner peripheral side of the other end portion of the body portion Rx3c toward the vertex on the outer peripheral side of the body portion Rx2c of the detection electrode Rx2 adjacent in the direction (counterclockwise direction) along the outer periphery of the display area DA. For example, the tapered portions Rx4d of the detection electrode Rx4 extend, respectively, from the vertex on the outer peripheral side of one end portion of the body portion Rx4c toward the vertex on the inner peripheral side of the body portion Rx1c of the detection electrode Rx1 adjacent in the direction (clockwise direction) along the outer periphery of the display area DA, and from the vertex on the inner peripheral side of the other end portion of the body portion Rx4c toward the vertex on the outer peripheral side of the body portion Rx3c of the detection electrode Rx3 adjacent in the direction (counterclockwise direction) along the outer periphery of the display area DA.

As described above, the tapered portion of the detection electrode Rx extends so as to face the tapered portion of the adjacent detection electrode Rx in the display device DSP according to the present embodiment. Incidentally, the tapered portions Rx1d to Rx4d of the plurality of detection electrodes Rx1 to Rx4 do not overlap each other in planar view. In addition, the tapered portions Rx1d to Rx4d of each of the plurality of detection electrodes Rx1 to Rx4 are not connected to the body portions of other detection electrodes adjacent in the direction along the outer periphery of the display area DA.

Figure 13:
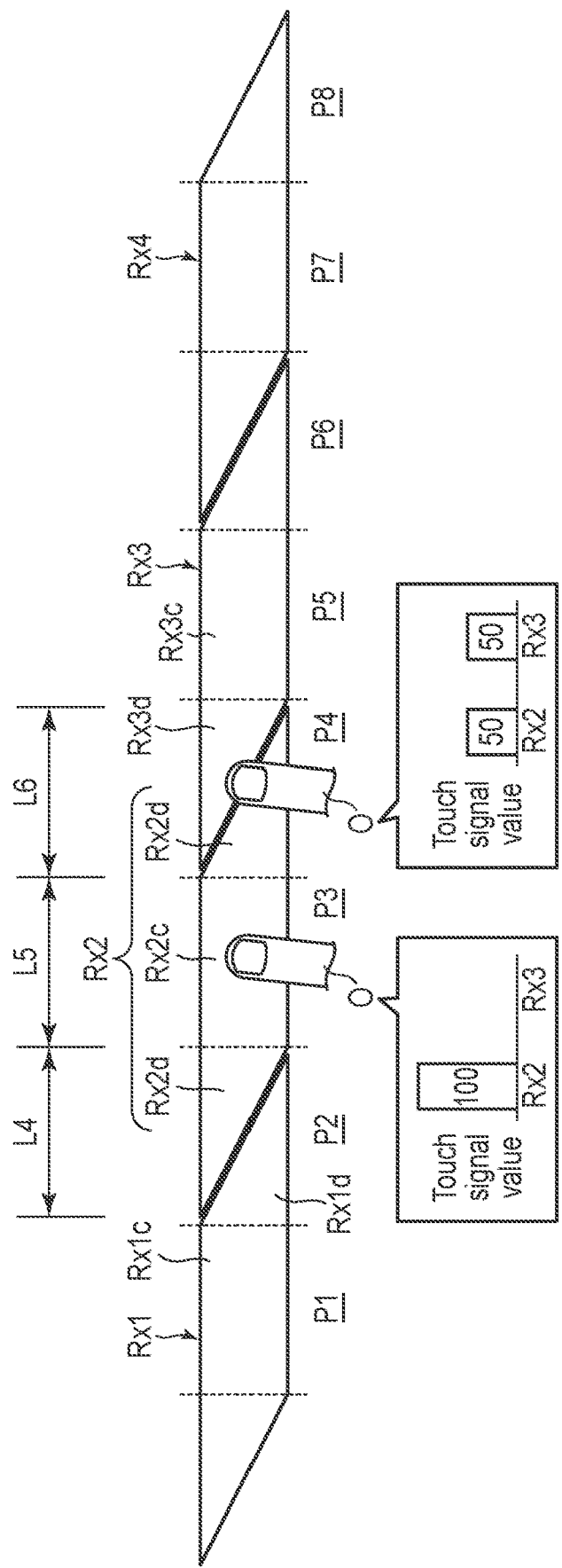
FIG. 13 is a developed view of a detection electrode shown in FIG. 12.

FIG. 13 is a developed view of the detection electrodes Rx1 to Rx4 shown in FIG. 12. Incidentally, the detection electrodes Rx1 to Rx4 have the same shape, and thus, only the detection electrode Rx2 will be described hereinafter, and a description regarding the other detection electrodes Rx1, Rx3, and Rx4 will be omitted.

As shown in FIG. 13, the detection electrode Rx2 includes the body portion Rx2c and the tapered portions Rx2d. The tapered portions Rx2d extend from both ends of the body portion Rx2c toward the body portions Rx1c and Rx3c of the adjacent detection electrodes Rx1 and Rx3. Out of the tapered portions Rx2d, the tapered portion Rx2d extending toward the body portion Rx1c of the adjacent detection electrode Rx1 is disposed to face the tapered portion Rx1d of the detection electrode Rx1. Out of the tapered portions Rx2d, the tapered portion Rx2d extending toward the body portion Rx3c of the adjacent detection electrode Rx3 is disposed to face the tapered portion Rx3d of the detection electrode Rx3.

The detection electrode Rx2 is formed such that a width L5 of the body portion Rx2c and widths L4 and L6 of the two tapered portions Rx2d extending from both the ends of the body portion Rx2c are substantially the same. In other words, the detection electrode Rx2 is formed such that the widths L4 to L6 have a substantially one-to-one relationship. That is, an area of a region where the body portion Rx2c of the detection electrode Rx2 is located, an area of a region where one of the tapered portions Rx2d is located, and an area of a region where the other tapered portion Rx2d is located are substantially the same.

Here, as shown in FIG. 13, a position where the body portion Rx1c of the detection electrode Rx1 is located is defined as a position P1; a position where the tapered portions Rx1d and Rx2d of the detection electrodes Rx1 and Rx2 are located is defined as a position P2; a position where the body portion Rx2c of the detection electrode Rx2 is located is defined as a position P3; a position where the tapered portions Rx2d and Rx3d of the detection electrodes Rx2 and Rx3 are located is defined as a position P4; a position where the body portion Rx3c of the detection electrode Rx3 is located is defined as a position P5; a position where the tapered portions Rx3d and Rx4d of the detection electrodes Rx3 and Rx4 are located is defined as a position P6; a position where the body portion Rx4c of the detection electrode Rx4 is located is defined as a position P7; and a position where the tapered portions Rx4d and Rx1d of the detection electrodes Rx4 and Rx1 are located is defined as a position P8.

Then, a case where the position P3 is touched by a finger O as shown in FIG. 13 is assumed. In this case, the finger O comes into contact with only the body portion Rx2c of the detection electrode Rx2, and thus, only a signal value of a detection signal RxAFE2 among detection signals RxAFE1 to RxAFE4 output from the detection electrodes Rx1 to Rx4 changes due to electrostatic capacitance of the finger O. Accordingly, the signal value of the detection signal RxAFE2 output from the detection electrode Rx2 is 100, and signal values of the detection signals RxAFE1, RxAFE3, and RxAFE4 output from the other detection electrodes Rx1, Rx3, and Rx4 not in contact with the finger O are all zero.

Next, a case where the position P4 is touched by the finger O as shown in FIG. 13 is assumed. In this case, the finger O comes into contact with the tapered portions Rx2d and Rx3d of the detection electrodes Rx2 and Rx3. Accordingly, changes in the signal values of the detection signals RxAFE2 and RxAFE3 among the detection signals RxAFE1 to RxAFE4 output from the detection electrodes Rx1 to Rx4 are observed due to the electrostatic capacitance of the finger O.

As described above, since the finger O is in contact with the comb tooth portions Rx2b and Rx3b of the detection electrodes Rx2 and Rx3 when the position P4 is touched by the finger O, the ratio between the contact area of the finger O in contact with the detection electrode Rx2 and the contact area of the finger O in contact with the detection electrode Rx3 can be approximated to 1:1. As described already, since the signal value of the detection signal RxAFE is proportional to the contact area between the detection electrode Rx and the finger O, in this case, the signal value of the detection signal RxAFE2 output from the detection electrode Rx2 is 50, and the signal value of the detection signal RxAFE3 output from the detection electrode Rx3 is also 50. Incidentally, the signal values of the detection signals RxAFE1 and RxAFE4 output from the detection electrodes Rx1 and Rx4 not in contact with the finger O are both zero.

In FIG. 13, the change in the signal value of the detection signal RxAFE when the position P3 or the position P4 is touched by the finger O has been described. Even when other positions are touched by the finger O, the signal value of the detection signal RxAFE changes according to a principle similar to that in the case of FIG. 13.

The signal values of the detection signals RxAFE1 to RxAFE4 output from the detection electrodes Rx1 to Rx4 are output to the touch controller TC. The touch controller TC can detect (determine) which position is touched by the finger O with reference to the signal values of the detection signals RxAFE1 to RxAFE4. Incidentally, a touch detection operation by the touch controller TC has no difference other than that steps S7 and S8 in the flowchart shown in FIG. 7 are omitted and that the processing proceeds to processing of step S9 when processing of step S5 is No, and thus, a detailed description thereof will be omitted here.

Although the case where the tapered portion is provided in a part of each of the detection electrodes Rx1 to Rx4 has been described in FIG. 13 described above, shapes of the detection electrodes Rx1 to Rx4 are not limited thereto.

Hereinafter, modified examples of the detection electrodes Rx1 to Rx4 will be described with reference to FIGS. 14 and 15.

FIG. 14 is a developed view showing a third modified example of the detection electrodes Rx1 to Rx4. Incidentally, since the detection electrodes Rx1 to Rx4 have the same shape, only the detection electrode Rx2 is focused on here. The third modified example shown in FIG. 14 is different from the case of FIG. 13 in that the body portion Rx2c has a region H (a slit or an opening portion) from which a part of the detection electrode Rx2 is removed. Accordingly, a signal value of the detection signal RxAFE output when the body portion Rx2c is touched can be matched with a signal value of the detection signal RxAFE output when the tapered portion Rx2d is touched as in the case of FIG. 9 of the first embodiment described above. For this reason, the touch controller TC may detect that the body portion Rx2c is touched when a signal value of one detection signal RxAFE is a predetermined value, and may detect that the tapered portion Rx2d is touched when signal values of the two detection signals RxAFE are the predetermined value. In other words, even if the touch controller TC does not hold a plurality of values related to the signal values, the touch controller TC can detect which portion is touched if the touch controller TC holds one value related to the signal value.

FIG. 15 is a developed view showing a fourth modified example of the detection electrodes Rx1 to Rx4. Incidentally, since the detection electrodes Rx1 to Rx4 have the same shape, only the detection electrode Rx2 is focused on here as well. The fourth modified example shown in FIG. 15 is different from the case of FIG. 13 in that not a part of the detection electrodes Rx1 to Rx4 but the entire detection electrodes Rx1 to Rx4 are formed in a tapered shape. In this case as well, there is no change in the fact that, for example, only the signal value of the detection signal RxAFE2 output from the detection electrode Rx2 changes when the position P3 is touched, and the signal values of the detection signals RxAFE2 and RxAFE3 output from the detection electrodes Rx2 and Rx3 change when the position P4 is touched, and thus, the touch controller TC can detect which position is touched by the series of touch detection operations described above.

In the second embodiment described above as well, the touch controller TC of the display device DSP can detect which position of a non-display area NDA is touched by using a difference in the signal values of the detection signals RxAFE1 to RxAFE4 output from the detection electrodes Rx1 to Rx4 each having the body portion and the tapered portions, so that it is possible to obtain the same effect as that of the first embodiment described above.

Figure 16:
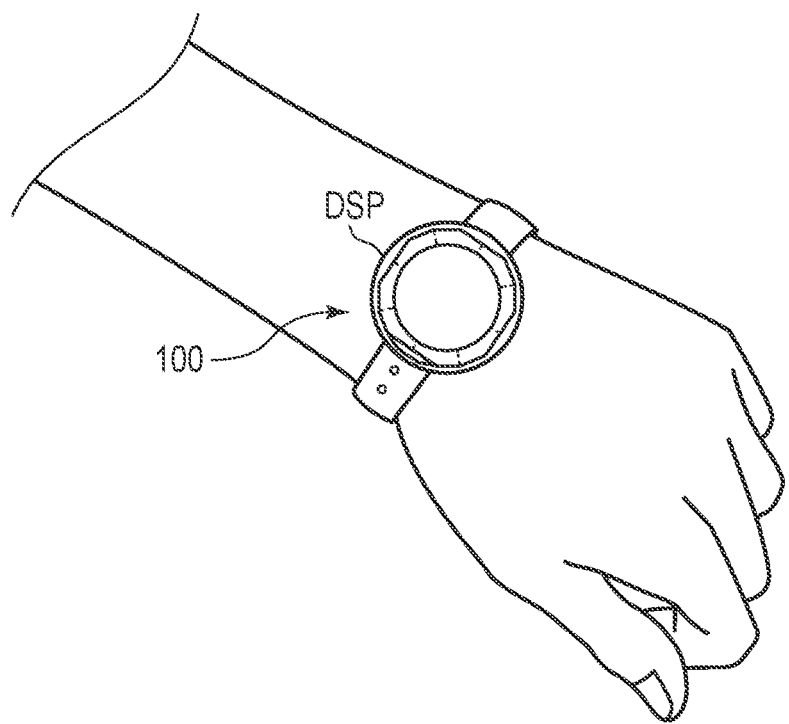
FIG. 16 is a view showing an application example of the display device according to each of the embodiments.

FIG. 16 shows an application example of the display device DSP according to each of the embodiments. As shown in FIG. 16, the display device DSP is applied to, for example, a wristwatch 100. In this case, the time or the like is displayed on the display area DA of the display device DSP, and the display device DSP can detect a predetermined gesture when a detection electrode disposed on the non-display area NDA is touched (for example, a gesture of touching an outer peripheral portion of the watch so as to make one rotation in the clockwise direction, a gesture of touching the outer peripheral portion of the watch so as to make one rotation in the counterclockwise direction, a tapping gesture, or the like), and can implement an operation according to the detected predetermined gesture.

Figure 17:
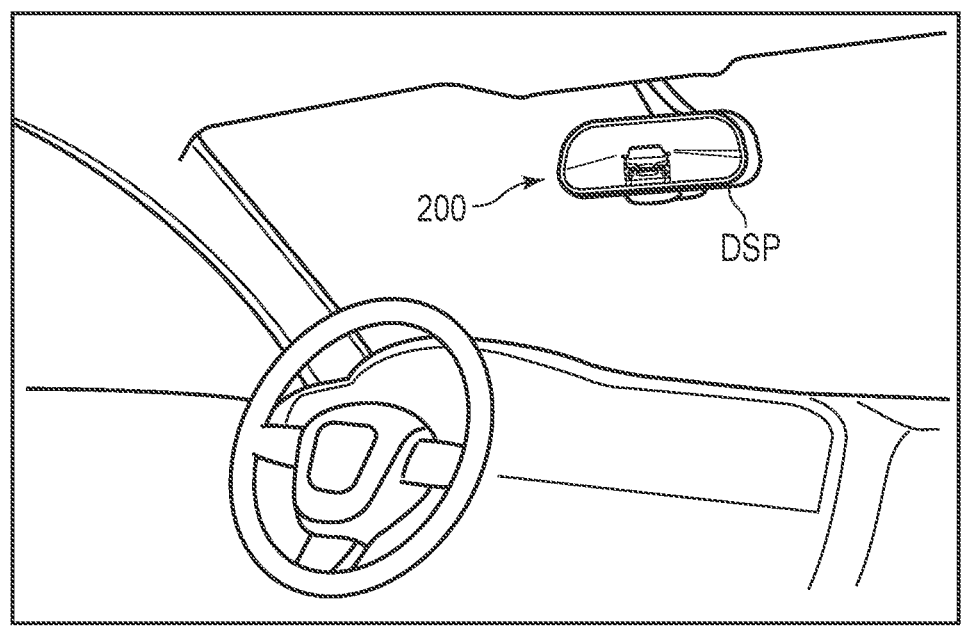
FIG. 17 is a view showing another application example of the display device according to each of the embodiments.

FIG. 17 shows another application example of the display device DSP according to each of the embodiments. As shown in FIG. 17, the display device DSP is applied to, for example, an in-vehicle rearview mirror 200. In this case, the display area DA of the display device DSP displays a video or the like of the rear of a vehicle captured by a camera installed in the vehicle, and the display device DSP can detect a predetermined gesture when a detection electrode disposed in the non-display area NDA is touched, and can implement an operation according to the detected predetermined gesture.

Figure 18:
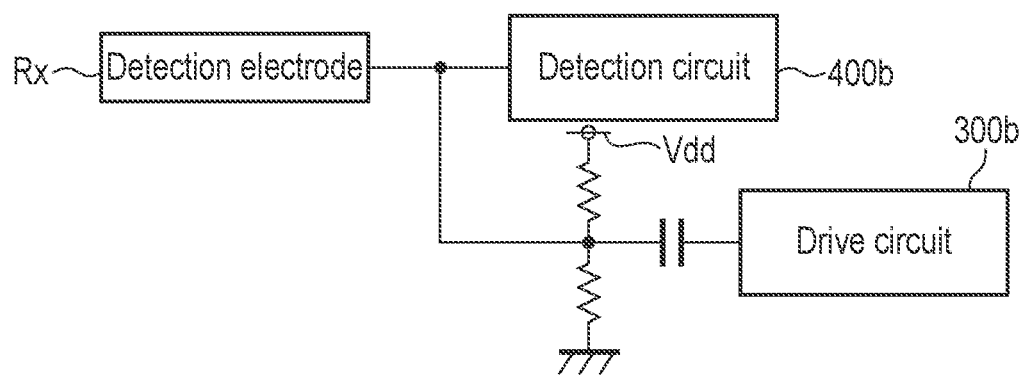
FIG. 18 is a view for describing an example of a principle of touch detection by self-capacitive sensing.

FIG. 18 is a view for describing an example of a principle of touch detection by self-capacitive sensing. A voltage obtained by dividing a voltage of a power source Vdd by voltage divider using resistor is supplied to the detection electrode Rx as a bias voltage. A drive signal having a predetermined waveform is supplied from a drive circuit 300b to the detection electrode Rx by capacitive coupling or the like, and a detection signal having a predetermined waveform is read from the detection electrode Rx. At this time, when a load due to the electrostatic capacitance by a finger or the like is applied to the detection electrode Rx, the amplitude of the detection electrode changes. In FIG. 18, the amplitude of the detection electrode Rx decreases. Therefore, in an equivalent circuit shown in FIG. 18, a detection circuit 400b detects the amplitude of the detection electrode Rx to detect the presence or absence of contact or an approach of an external proximity object such as the finger. Incidentally, a self-detection circuit is not limited to the circuit shown in FIG. 18, and any circuit system may be adopted as long as the presence or absence of the external proximity object such as the finger can be detected only using a detection electrode.

According to at least one embodiment described above, it is possible to efficiently detect which position of the non-display area NDA has been touched using the limited number of the detection electrodes Rx1 to Rx4 disposed in the non-display area NDA, and it is possible to provide a display device, a detection device, and a watch which achieve display quality at the time of displaying an image and excellent operability by touch together.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a display area that displays an image;
   a first sensor electrode disposed in a peripheral area surrounding the display area;
   a second sensor electrode disposed in the peripheral area and disposed adjacent to the first sensor electrode; and
   a detector electrically connected to the first sensor electrode and the second sensor electrode, wherein
   the first sensor electrode and the second sensor electrode both have a body portion and a comb tooth portion having a plurality of linear electrodes, and
   a comb tooth portion of the first sensor electrode and a comb tooth portion of the second sensor electrode are disposed at mutually different locations.

2. The display device of claim 1, wherein
a body portion of the first sensor electrode is disposed in a first region of the peripheral area,
a body portion of the second sensor electrode is disposed in a second region of the peripheral area,
the comb tooth portion of the first sensor electrode and the comb tooth portion of the second sensor electrode are disposed in a third region of the peripheral area, and
areas of the first region, the second region, and the third region are equal.

3. The display device of claim 1, wherein
the first sensor electrode and the second sensor electrode both have the body portion and the comb tooth portion connected by a wire portion.

4. The display device of claim 1, wherein
the first sensor electrode and the second sensor electrode both have an opening portion in the body portion.

5. The display device of claim 1, further comprising:
a common electrode disposed on the display area; and
a plurality of pixel electrodes disposed on the display area and disposed to be opposed to the common electrode, wherein
the first sensor electrode and the second sensor electrode are disposed in a same layer as the common electrode.

6. The display device of claim 1, further comprising:
a common electrode disposed on the display area; and
a plurality of pixel electrodes disposed on the display area and disposed to be opposed to the common electrode, wherein
the first sensor electrode and the second sensor electrode are disposed in a same layer as the pixel electrodes.

7. The display device of claim 1, wherein
all the body portions and the comb tooth portions of the first sensor electrode and the second sensor electrode are disposed along an outer periphery of the display area formed in a curved shape.

8. The display device of claim 2, wherein
the detector
determines that an external proximity object approaches or comes into contact with the first region when a signal from the first sensor electrode is larger than a signal from the second sensor electrode by a predetermined range or more,
determines that the external proximity object approaches or comes into contact with the second region when the signal from the second sensor electrode is larger than the signal from the first sensor electrode by a predetermined range or more, and
determines that the external proximity object approaches or comes into contact with the third region when a difference between the signal from the first sensor electrode and the signal from the second sensor electrode falls within a predetermined range.

9. A watch comprising the display device of claim 1.

10. A display device comprising:
a display area that displays an image;
a first sensor electrode disposed in a peripheral area surrounding the display area;
a second sensor electrode disposed in the peripheral area and disposed adjacent to the first sensor electrode; and
a detector electrically connected to the first sensor electrode and the second sensor electrode, wherein
the first sensor electrode and the second sensor electrode both have a body portion and a tapered portion,
a tapered portion of the first sensor electrode and a tapered portion of the second sensor electrode are disposed to face each other, and
all the body portions and the tapered portions of the first sensor electrode and the second sensor electrode are disposed along an outer periphery of the display area formed in a curved shape.

11. The display device of claim 10, wherein
the body portion of the first sensor electrode is disposed in a first region of the peripheral area,
the body portion of the second sensor electrode is disposed in a second region of the peripheral area,
the tapered portion of the first sensor electrode and the tapered portion of the second sensor electrode are disposed in a third region of the peripheral area, and
areas of the first region, the second region, and the third region are equal.

12. A watch comprising the display device of claim 10.

13. A detection device comprising:
a first sensor electrode;
a second sensor electrode disposed adjacent to the first sensor electrode; and
a detector electrically connected to the first sensor electrode and the second sensor electrode, wherein
the first sensor electrode and the second sensor electrode both have a body portion and a comb tooth portion having a plurality of linear electrodes,
a comb tooth portion of the first sensor electrode and a comb tooth portion of the second sensor electrode are disposed at mutually different locations,
a body portion of the first sensor electrode is disposed in a first region,
a body portion of the second sensor electrode is disposed in a second region different from the first region,
the comb tooth portion of the first sensor electrode and the comb tooth portion of the second sensor electrode are disposed in a third region, which is different from the first region and the second region, and
areas of the first region, the second region, and the third region are equal.

14. The detection device of claim 13, wherein
the first sensor electrode and the second sensor electrode both have the body portion and the comb tooth portion connected by a wire portion.

15. The detection device of claim 13, wherein
the first sensor electrode and the second sensor electrode both have an opening portion in the body portion.

16. The detection device of claim 13, wherein
all the body portions and the comb tooth portions of the first sensor electrode and the second sensor electrode are disposed in a curved shape.

17. A watch comprising the detection device of claim 13.

* * * * *